(12) United States Patent
Hayashi et al.

(10) Patent No.: US 6,352,875 B1
(45) Date of Patent: *Mar. 5, 2002

(54) PHOTOELECTRIC CONVERSION APPARATUS AND METHOD OF MANUFACTURING THE SAME

(75) Inventors: Shinichi Hayashi, Ebina; Akira Funakoshi, Atsugi; Akira Tago, Utsunomiya; Satoshi Okada, Zama; Shinichi Takeda, Atsugi; Eiichi Takami, Chigasaki; Masakazu Morishita, Hiratsuka; Chiori Mochizuki, Zama; Tadao Endo, Atsugi; Toshikazu Tamura, Utsunomiya, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,258

(22) Filed: Oct. 21, 1998

Related U.S. Application Data

(62) Division of application No. 08/733,772, filed on Oct. 18, 1996, now Pat. No. 5,856,699.

(30) Foreign Application Priority Data

| Oct. 20, 1995 | (JP) | 7-272997 |
|---|---|---|
| Jan. 19, 1996 | (JP) | 8-007324 |
| Oct. 8, 1996 | (JP) | 8-267138 |

(51) Int. Cl.$^7$ .................................... H01L 31/0203
(52) U.S. Cl. .................. 438/67; 136/256; 136/244; 257/433; 257/782; 257/783; 257/786; 257/443; 257/459; 438/57; 438/64; 438/73; 438/80; 438/455; 438/456; 156/299; 156/241; 156/265

(58) Field of Search ....................... 257/433, 782, 257/783, 786, 443, 459; 136/244, 256; 438/57, 64, 73, 80, 455, 456, 67, 66, 28, 107; 156/299, 241, 265

(56) References Cited

U.S. PATENT DOCUMENTS

| 4,537,827 A | * | 8/1985 | Little et al. ............... 428/409 |
|---|---|---|---|
| 4,957,882 A | | 9/1990 | Shinomiya |
| 4,999,077 A | * | 3/1991 | Drake et al. ............. 156/299 |
| 4,999,484 A | | 3/1991 | Kaneko ..................... 250/208 |
| 5,068,713 A | * | 11/1991 | Toda ......................... 257/680 |
| 5,121,225 A | | 6/1992 | Murata ..................... 358/471 |
| 5,856,699 A | * | 1/1999 | Hayashi et al. ........... 257/433 |

FOREIGN PATENT DOCUMENTS

| EP | 0 355 522 | 2/1990 |
|---|---|---|
| EP | 0 529 981 | 3/1993 |

* cited by examiner

Primary Examiner—Alan Diamond
(74) Attorney, Agent, or Firm—Fitzpatrick, Cella, Harper & Scinto

(57) ABSTRACT

In a photoelectric conversion apparatus obtained by arranging and fixing a plurality of semiconductor element substrates onto a base with an adhesive, the levels of the upper surfaces of the substrates are adjusted with a desired thickness of the adhesive so as to set the upper surfaces within the same plane while the distance from the upper surface of the base to the semiconductor element surface of each substrate is kept to a design value, thereby realizing a photoelectric conversion apparatus constituted by a plurality of substrates arranged two-dimensionally, which eliminates level gaps between the substrates, and hence is free from problems such as a decrease in resolution, a deterioration in sensitivity, and peeling of a phosphor and the like.

60 Claims, 25 Drawing Sheets

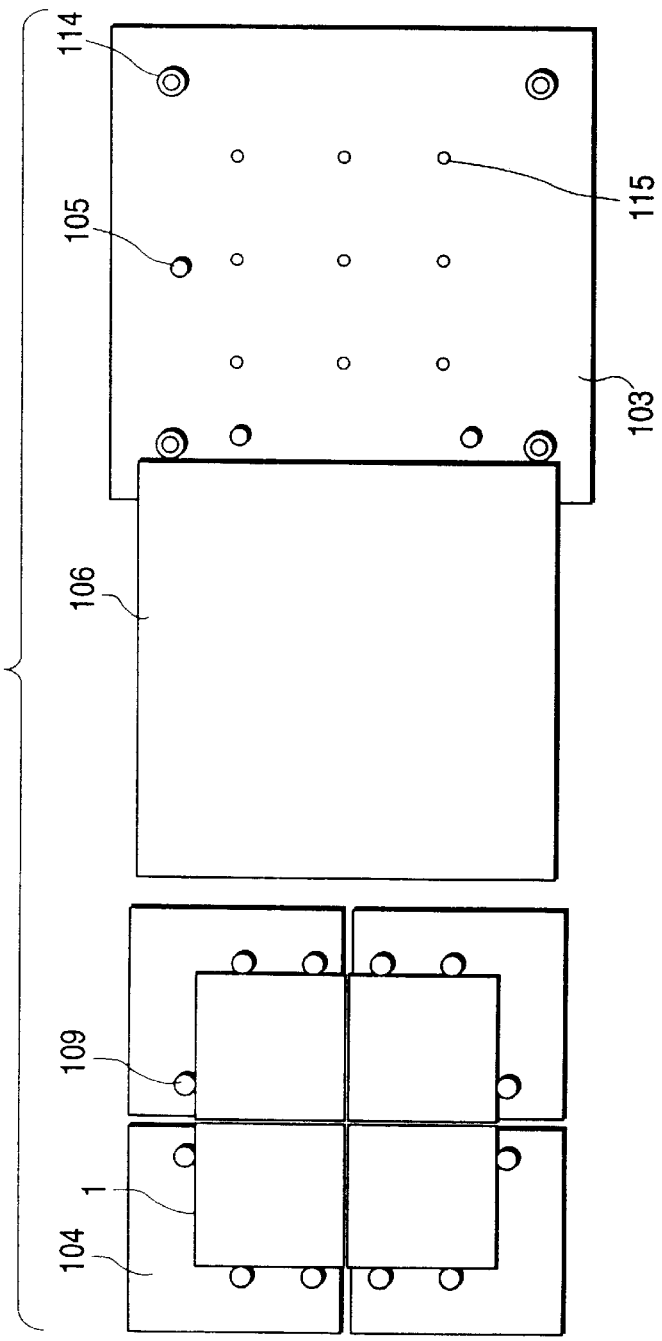
FIG. 17A
FIG. 17B

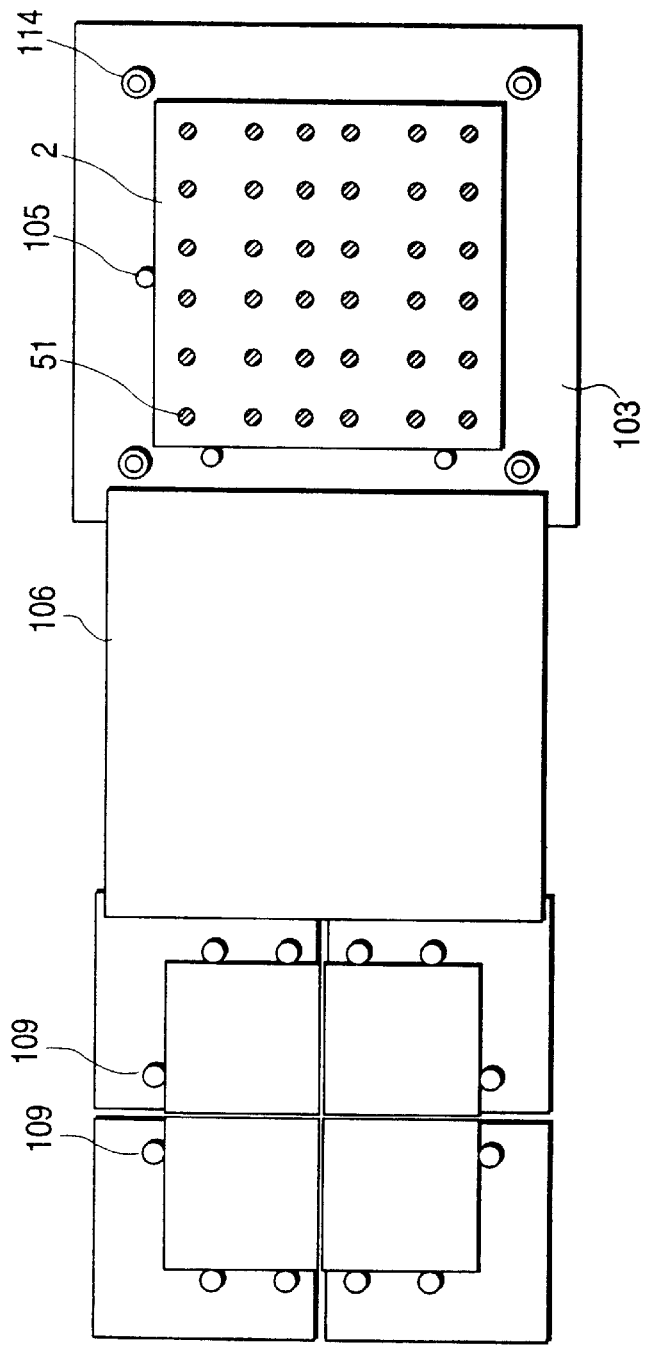
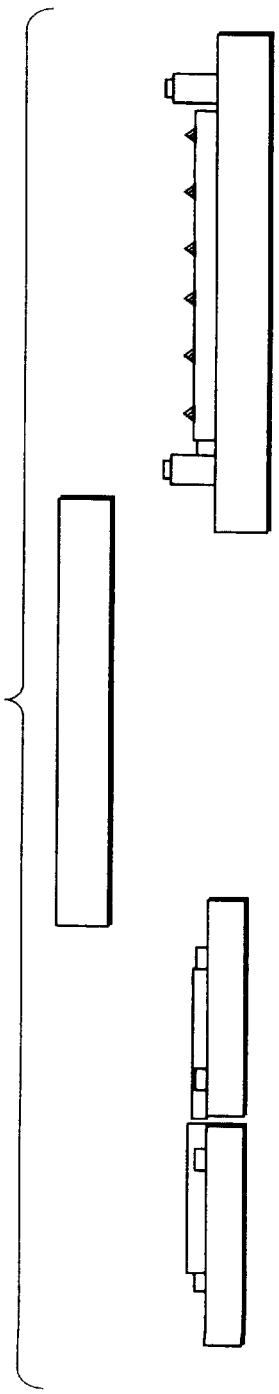
FIG. 18A
FIG. 18B

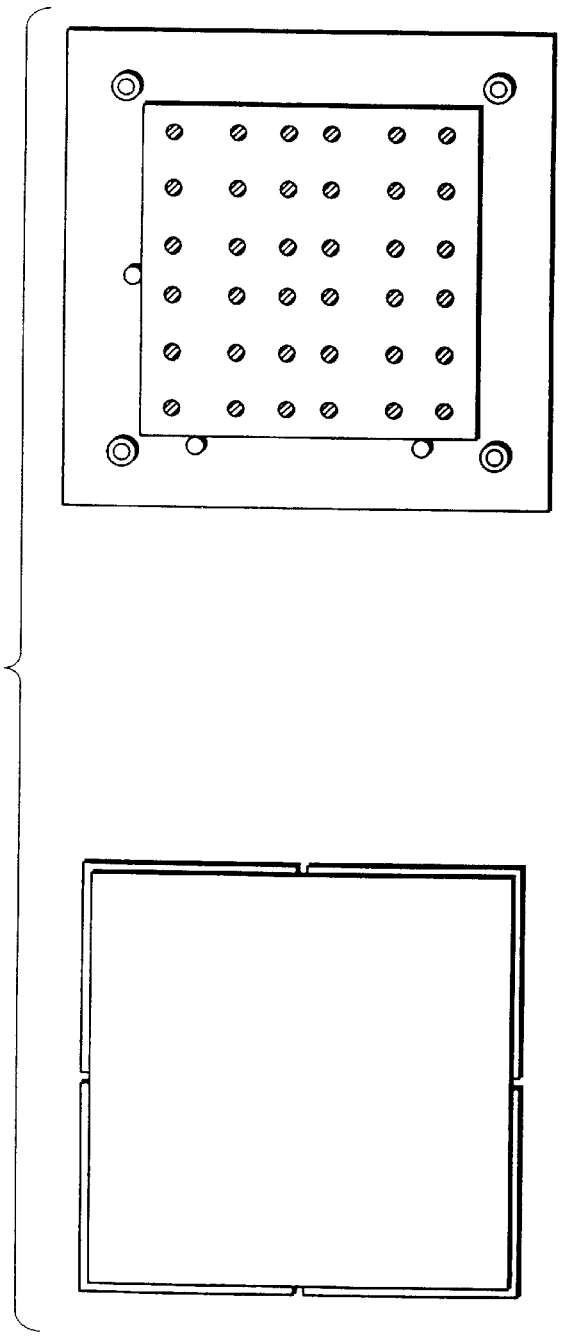
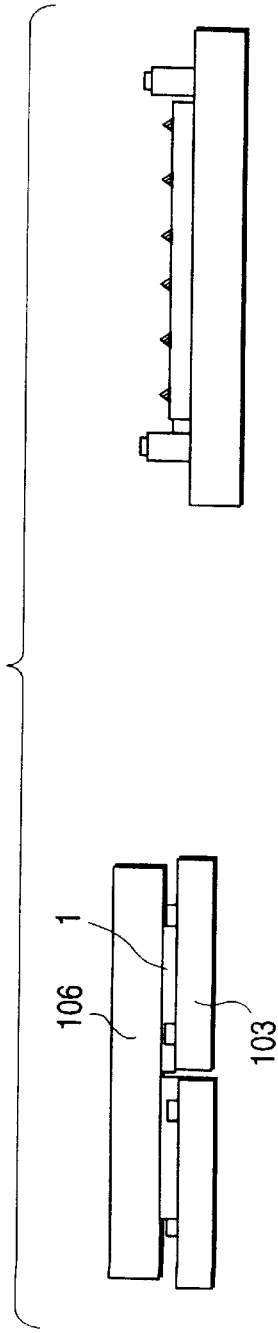
FIG. 19A
FIG. 19B

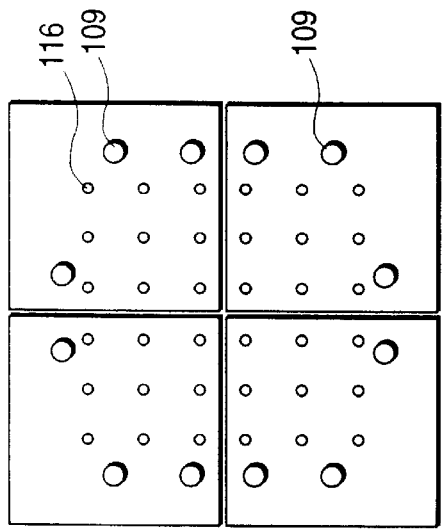
FIG. 20A
FIG. 20B

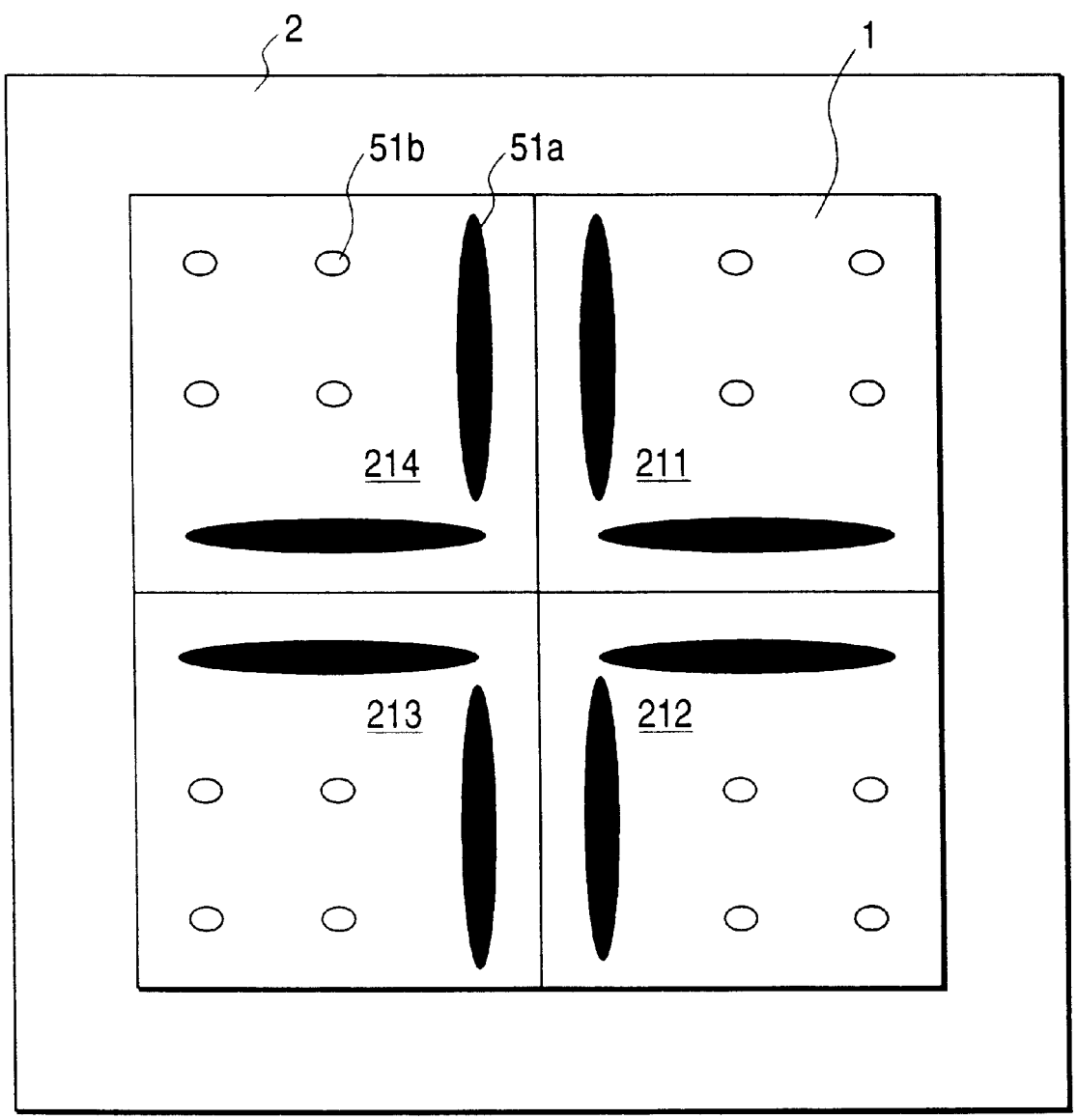

PHOTOELECTRIC CONVERSION APPARATUS AND METHOD OF MANUFACTURING THE SAME

This application is a division of application Ser. No. 08/733,772, filed Oct. 18, 1996, now issued as U.S. Pat. No. 5,856,699 on Jan. 5, 1999.

BACKGROUND OF THE INVENTION

1. Field of the Invention

The present invention relates to a photoelectric conversion apparatus and, more particularly, to a photoelectric conversion apparatus formed by using a large-area process, which is suitably used as a two-dimensional photoelectric conversion apparatus for performing a one-to-one read operation in, e.g., a facsimile apparatus, a digital copying machine, or an X-ray image pickup or imaging apparatus.

2. Related Background Art

Conventionally, as a document reader in a facsimile apparatus, a copying machine, an X-ray image pickup apparatus, or the like, a read system using a reducing optical system and a CCD type sensor has been used. With the recent development in photoelectric conversion semiconductor materials typified by hydrogenated amorphous silicon (to be referred to as a-Si hereinafter), there has been a remarkable development in a so-called contact type sensor, which is obtained by forming photoelectric conversion elements and a signal processing unit on a substrate having a large area, and designed to read an image of an information source through a one-to-one optical system. Since a-Si can be used not only as a photoelectric conversion material but also as a thin-film field effect transistor (to be referred to as a TFT hereinafter), a photoelectric conversion semiconductor layer and a TFT semiconductor layer can be formed at the same time.

Furthermore, switching elements such as a thin-film field effect transistor and a capacitive element exhibit good matching and have the same film structure. For this reason, these elements can be formed as a common film at the same time. In addition, a photoelectric conversion apparatus having a higher S/N ratio can be manufactured at a lower cost. Furthermore, since each capacitor has an insulating layer commonly used as an intermediate layer and can be formed to have good characteristics, a high-performance photoelectric conversion apparatus capable of outputting the integral value of pieces of optical information obtained by a plurality of photoelectric conversion elements with a simple structure can be provided. With the use of a low-cost, large-area, high-performance photoelectric conversion apparatus, a facsimile apparatus or X-ray apparatus with added values can be provided.

In manufacturing a photoelectric conversion apparatus having a large screen, it is difficult to completely remove minute dust in the manufacturing process, especially dust peeling off from the wall of a thin-film deposition apparatus in the process of depositing an amorphous silicon layer on a substrate, and dust left on a substrate when a metal layer is deposited thereon. For this reason, with an increase in the size of a substrate, it becomes more difficult to eliminate wiring (interconnect) failures caused by dust and the like, such as a short circuit and an open circuit (disconnection) of wiring layers. In manufacturing a large-screen photoelectric conversion apparatus 121 by using one substrate, as shown in FIG. 1, with an increase in the size of a substrate, the yield per substrate decreases, and at the same time, the lost revenues per substrate increase.

As described above, at present, it is difficult to sufficiently decrease the cost of a large-area photoelectric conversion apparatus using one large-area substrate. Under the circumstances, a large-area photoelectric conversion apparatus is manufactured by using a plurality of substrates, e.g., silicon wafers or thin glass plates, having photoelectric conversion elements formed on their surfaces, and mounting the substrates on a base in the form of an array.

FIG. 2A is a schematic plan view showing such a photoelectric conversion apparatus obtained by two-dimensionally arranging a plurality of substrates. FIG. 2B is a schematic side view of the apparatus. Referring to FIGS. 2A and 2B, the apparatus includes substrates 1 and a base 2. An adhesive 51 is used to fix the substrates 1 to the base 2.

As the substrates 1, silicon wafers or thin glass plates are generally used. The thickness tolerance of silicon wafers is $\pm 25\mu$. The thickness tolerance of thin glass plates is $\pm 200\mu$. In general, semiconductor elements are formed on the upper surfaces of the substrates 1. In mounting the semiconductor elements on the substrates 1, the lower surfaces of the substrates 1 are bonded to the base 2 in most cases.

When, however, the substrates 1 are fixed to the base 2 with the adhesive 51 with a constant thickness, the respective substrates 1 exhibit level gaps, resulting in considerable deterioration in the performance of the photoelectric conversion apparatus.

FIG. 2B is a schematic side view showing such a level gap B between the substrates. For the sake of easy understanding, the gap B is emphasized. As shown in FIG. 2B, thicknesses $T_1$ and $T_2$ of the substrates 1 exhibit a variation. If, therefore, a thickness $t_2$ of the adhesive 51 is made constant, the upper surfaces (semiconductor element portions) of the respective substrates 1 are set at different levels, resulting in the level gap B between the substrates 1.

With the occurrence of the level gap B between the substrates, the distance between a phosphor formed on a given substrate, or an object (original), and a semiconductor element may increase beyond an allowable range. As a result, the object may become out of focus to cause a decrease in resolution or sensitivity.

When a phosphor is to be bonded to the semiconductor element surfaces of the substrates 1, since the semiconductor element surfaces of the substrates 1 in the array have different levels, it is impossible to tightly bond the phosphor to all the substrates 1. Even if the phosphor can be bonded to the substrates 1, such level differences may cause the phosphor to peel off.

Conventionally, in order to eliminate the level gap B and set the respective substrates at the same level, the substrates are polished to the same thickness in advance. Such a process, however, requires much time and many steps, resulting in an increase in cost.

SUMMARY OF THE INVENTION

It is an object of the present invention to solve the above problem by forming a large-area photoelectric conversion apparatus constituted by a plurality of substrates, each of which has photoelectric conversion elements mounted thereon, and which are arranged to be adjacent to each other, and to improve the performance of the photoelectric conversion apparatus.

It is another object of the present invention to realize a photoelectric conversion apparatus constituted by a plurality of substrates that are two-dimensionally arranged, in which the level gaps between the substrates are eliminated to solve problems such as a focus error, a decrease in resolution, a deterioration in sensitivity, and peeling of a phosphor bonded to the surface of each substrate, by a simple method.

It is still another object of the present invention to provide a photoelectric conversion apparatus in which substantially no changes in the spaces between adjacent substrates on a base occur, and no variation in the pitch of photoelectric conversion elements occurs.

It is still another object of the present invention to provide a photoelectric conversion apparatus having an arrangement which attains a high yield of products and a low cost and can solve the above problem, and a method of manufacturing the same.

It is still another object of the present invention to provide a photoelectric conversion apparatus constituted by a plurality of semiconductor element substrates arranged and fixed onto a base with an adhesive, wherein levels of opposite surfaces of the plurality of substrates to the base are adjusted in accordance with a thickness of the adhesive, with which the substrates are bonded, such that the opposite surfaces are set within the same plane.

It is still another object of the present invention to provide a photoelectric conversion apparatus constituted by a plurality of substrates, each of which has photoelectric conversion elements, and which are bonded to a base to be adjacent to each other, wherein the substrates are bonded to the base with an adhesive having elasticity.

It is still another object of the present invention to provide a manufacturing method for a photoelectric conversion apparatus constituted by a plurality of semiconductor element substrates arranged and fixed onto a base with an adhesive, comprising the step of hardening the adhesive while a distance from an upper surface of the base to a semiconductor element surface of each of the substrates is kept to a design value.

It is still another object of the present invention to provide a mounting apparatus for a photoelectric conversion apparatus constituted by a plurality of semiconductor element substrates arranged and fixed onto a base with an adhesive, comprising means for holding the substrate until the adhesive hardens while a distance from an upper surface of the base to a semiconductor element surface of the substrate is kept to a design value.

According to the present invention, in a photoelectric conversion apparatus constituted by a plurality of substrates, each of which has semiconductor elements, and which are arrayed on one base having a plane, one array of substrates each having semiconductor elements are mounted such that the semiconductor element surfaces of the substrates are set within the same plane, and the respective substrates are fixed while variations in the thicknesses of the substrates are adjusted with the thickness of an adhesive.

According to the present invention, a plurality of substrates, each of which has photoelectric conversion elements mounted thereon, are bonded to a base with an adhesive resin to be adjacent to each other, and an elastic adhesive resin is used as the adhesive resin. A force produced by the difference in thermal expansion coefficient between the substrates and the base with a change in ambient environmental temperature or the like is absorbed by the elasticity of the adhesive resin, thereby suppressing variations in the spaces between the adjacent substrates and making the spaces between the adjacent substrates constant regardless of changes in ambient environmental temperature or the like.

According to the present invention, in a photoelectric conversion apparatus constituted by at least two substrates, each of which has photoelectric conversion elements two-dimensionally arranged and mounted thereon, and which are bonded within a plane, the difference in thermal expansion coefficient between the substrates, on which the photoelectric conversion elements are mounted, and a base is absorbed by a fixing adhesive resin having no elasticity and a semi-fixing adhesive resin having elasticity, which are used to bond the substrates, thereby making the spaces between the substrates substantially uniform regardless of changes in ambient environmental temperature.

In a photoelectric conversion apparatus constituted by two or more substrates bonded to a base, the problem caused by the difference in expansion coefficient between each substrate, on which photoelectric conversion elements are mounted, and the base is solved by a combination of coating weights and application positions of a fixing adhesive resin having no elasticity and a semi-fixing adhesive resin having elasticity, which are used to bond the substrates.

Adhesives used for bonding can be properly selected in accordance with the materials used for the bonding surfaces of the substrates and base which are bonded to each other. If the principal object is to adjust the level of each substrate, an adhesive exhibiting no or little contraction upon hardening is preferably selected.

An adhesive having elasticity is also preferably used for the following reason even if the adhesive is not completely uniform. When the photoelectric conversion apparatus is to read an object in tight contact, a read operation can be performed while the adhesive is made uniform by pressing it.

If, however, the apparatus is used in a pressed state, the use of the apparatus is undesirably limited. For this reason, an elastic adhesive without hardening contraction is preferably selected.

As a preferred adhesive which can be used for the present invention, an acrylic-based, epoxy-based, or silicone-based adhesive is available. As an adhesive resin having elasticity, especially rubber-like elasticity, a silicone-based adhesive resin, a butyl-rubber adhesive resin, a polysulfide-based adhesive resin, a styrene-rubber-based adhesive resin, a nitrile-rubber-based adhesive resin, or a chloroprene-based adhesive resin an be used.

As is apparent, as an adhesive resin, a one-part or two-part adhesive may be used. These adhesives may be used in combination or mixed, as needed.

BRIEF DESCRIPTION OF THE DRAWINGS

FIGS. 6A and 6B, 7A and 7B, 8A and 8B, 9A and 9B, 10A and 10B, 11A and 11B, 12A and 12B, 13A and 13B, 14A and 14B, 17A and 17B, 18A and 18B, 19A and 19B, and 20A and 20B are respectively schematic plan views and schematic sectional views each for explaining a preferred example of the mounting procedure for the photoelectric conversion apparatus of the present invention;

FIGS. 23, 24, 27, 28, and 29 are schematic plan views each for explaining a preferred example of the photoelectric conversion apparatus of the present invention;

DETAILED DESCRIPTION OF THE PREFERRED EMBODIMENTS

[First Embodiment]

Figure 1:
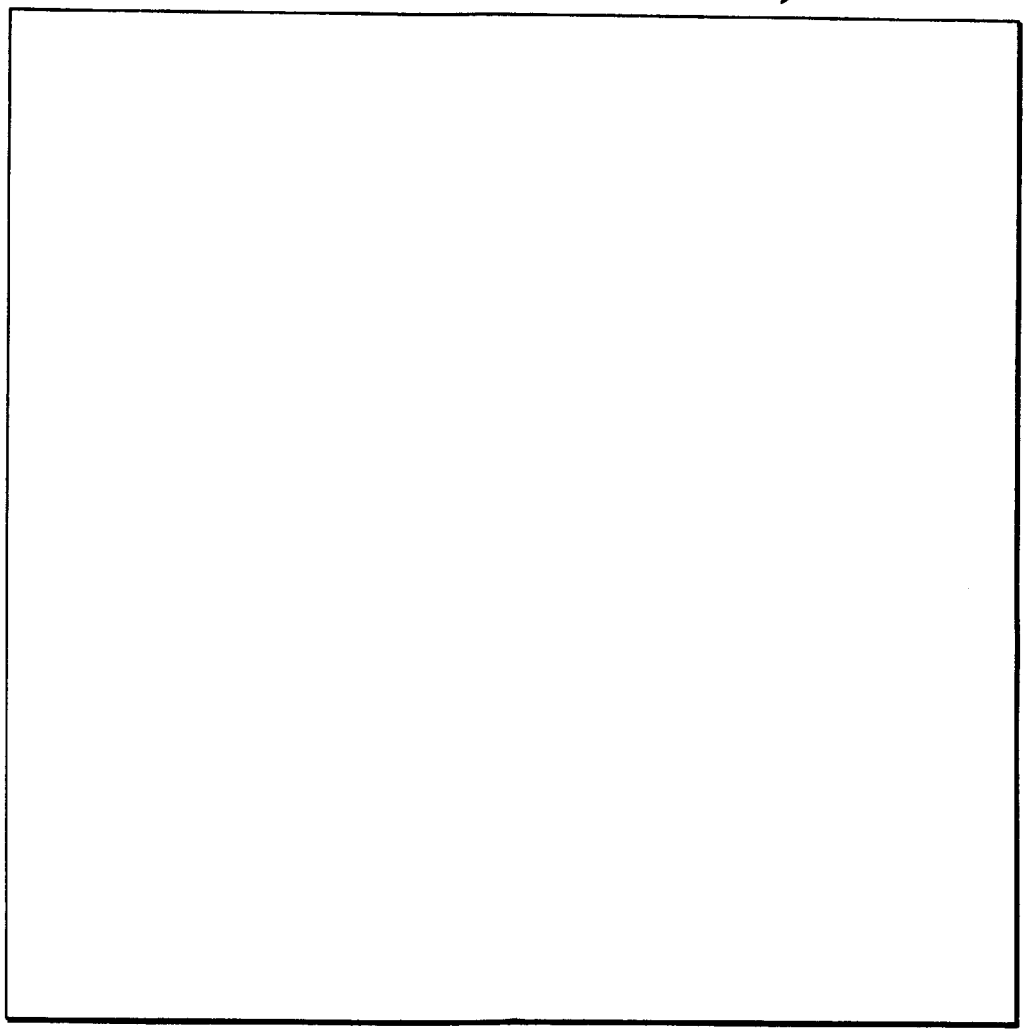
FIG. 1 is a schematic plan view for explaining a substrate having photoelectric conversion elements.
Figure 2A:
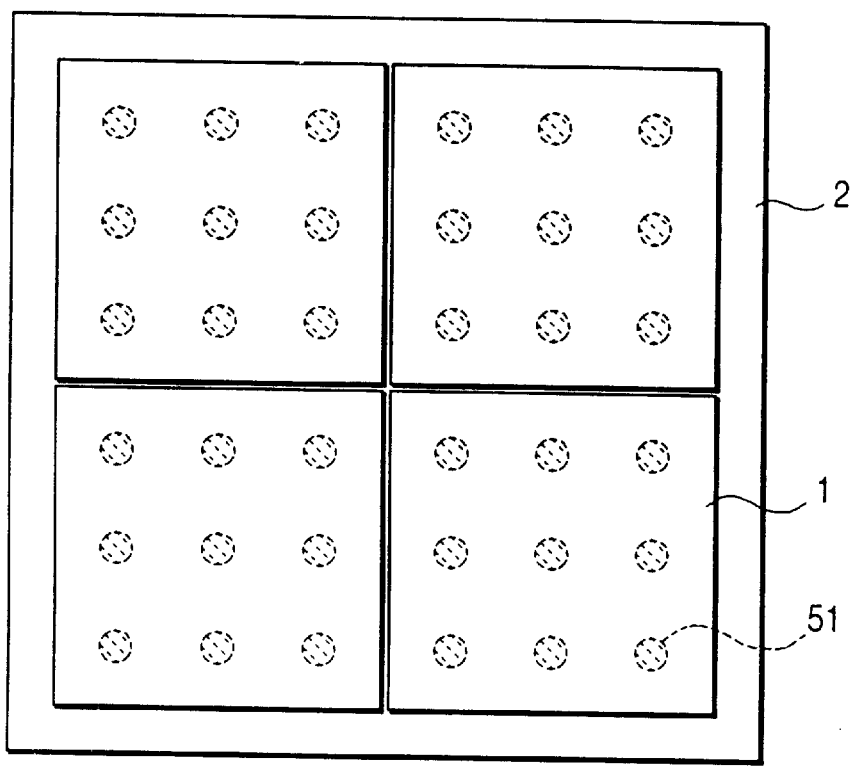
FIG. 2A is a schematic plan view for explaining a photoelectric conversion apparatus.
Figure 2B:
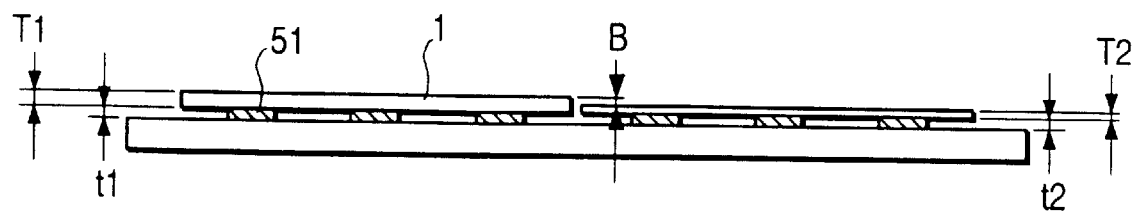
FIG. 2B is a schematic sectional view of the apparatus in FIG. 2A.
Figure 3A:
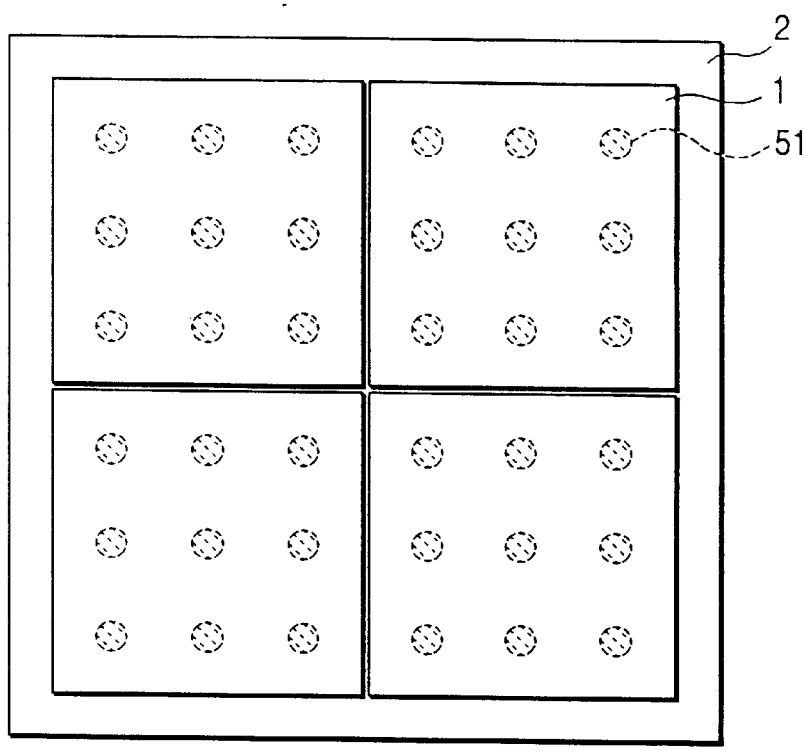
FIG. 3A is a schematic plan view for explaining a photoelectric conversion apparatus according to a preferred embodiment of the present invention.
Figure 3B:
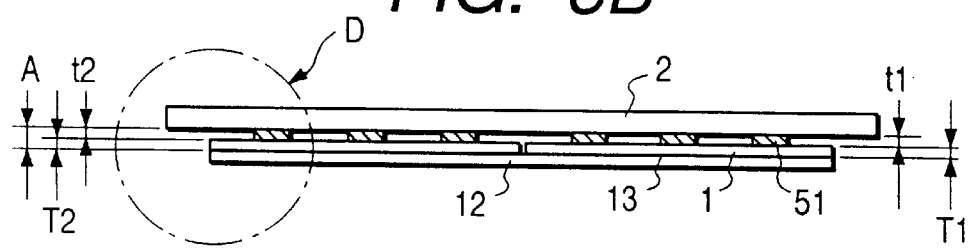
FIG. 3B is a schematic sectional view of the apparatus in FIG. 3A.

FIG. 3A is a schematic plan view showing a photoelectric conversion apparatus according to a preferred embodiment of the present invention. FIG. 3B is a schematic sectional view of the apparatus. Referring to FIGS. 3A and 3B, four substrates 1 are fixed onto a base 2 with an adhesive 51 such that their semiconductor element 13 surfaces are even. A phosphor 12 serves as a wavelength conversion member. In this arrangement, incident radiation such as X-rays or electromagnetic waves in a wavelength region in which photoelectric conversion elements have no or low sensitivity is converted into light in a wavelength region in which the elements have sufficient sensitivity, and the light is output to the elements. In this manner, the above apparatus can be made to function as an X-ray image pickup apparatus.

Figure 4:
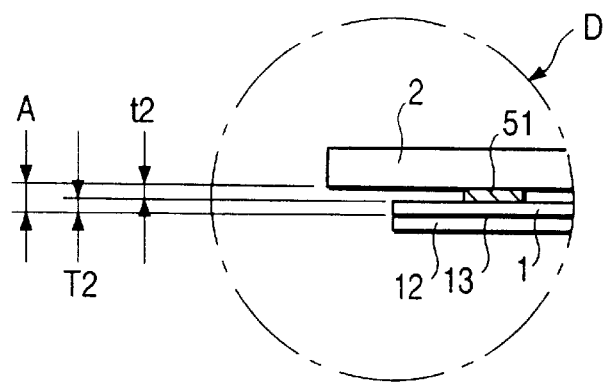
FIG. 4 is an enlarged schematic sectional view of the portion indicated by a circle D in FIG. 3B.

FIG. 4 is an enlarged view of a portion D in FIG. 3B.

As shown in FIG. 3B, the substrates 1 in this embodiment have different thicknesses $T_1$ and $T_2$, but the levels of the substrates 1 are adjusted with thicknesses $t_1$ and $t_2$ of the adhesive 51 such that the upper surfaces of all the substrates 1 are set at a level A.

Figure 5:
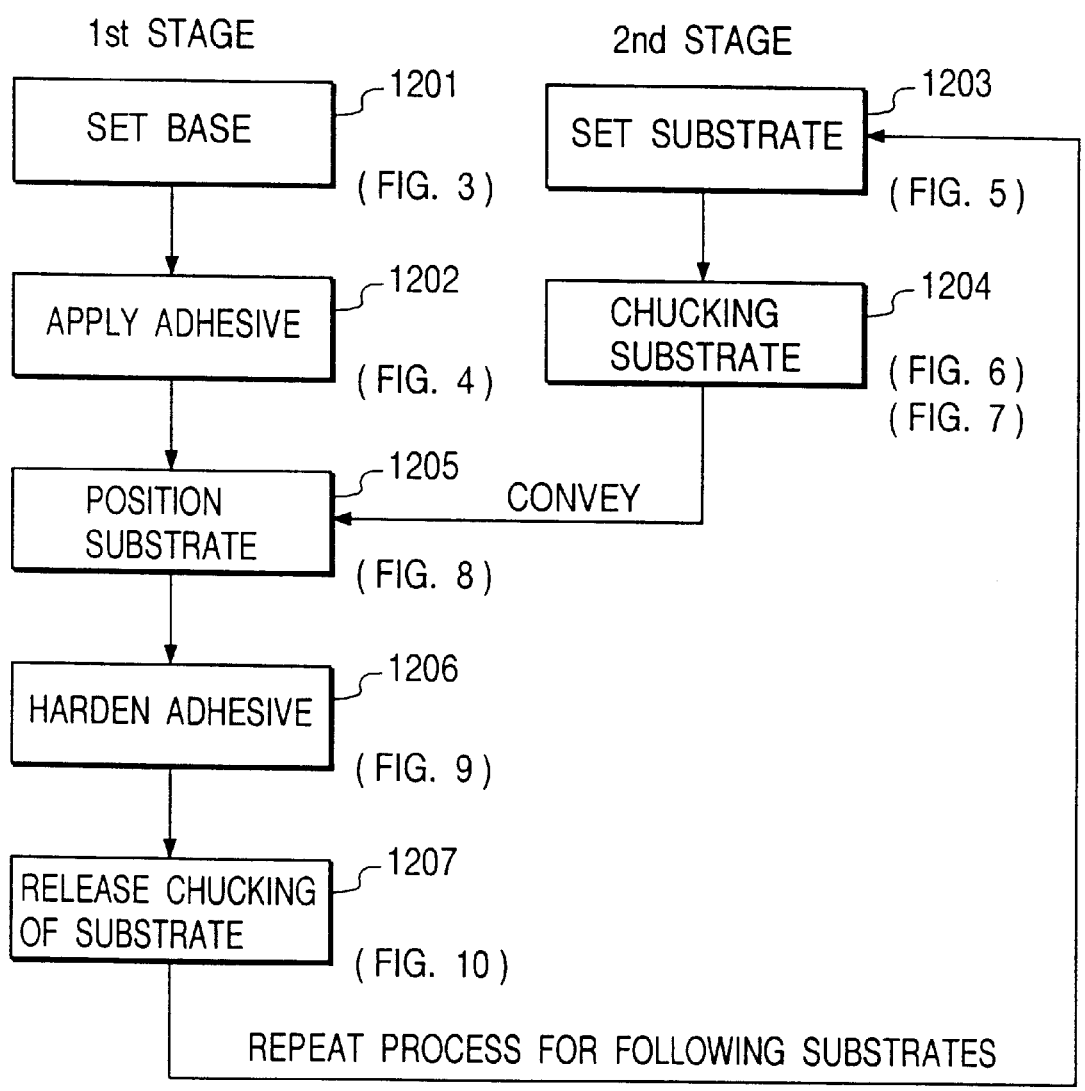
FIGS. 5 and 16 are flow charts each for explaining a preferred example of the mounting procedure in the present invention.

A method of mounting the substrates in this embodiment will be described next with reference to the flow chart of FIG. 5 and the accompanying drawings. The substrate mounting method will be described below with reference to the flow chart of FIG. 5.

First of all, "setting of base" is performed (step 1201).

Figure 6A:
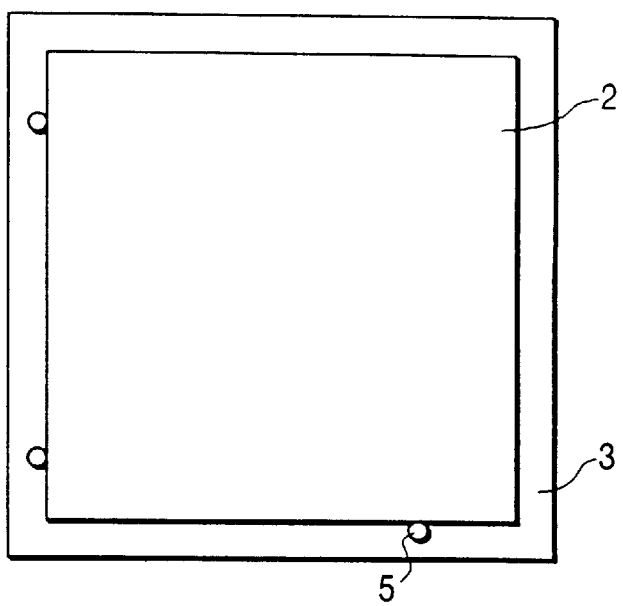
Figure 6B:
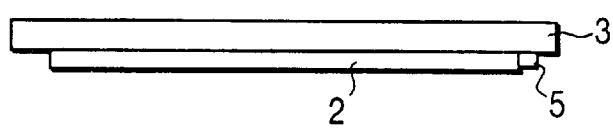

FIG. 6A is a schematic plan view showing a state in which the base 2 is set on a first stage 3. FIG. 6B is a schematic sectional view of the structure in FIG. 6A. The base 2 is set in contact with three positioning pins 5 mounted on the first stage 3. At this time, the lower surface of the base 2 is vacuum-chucked by the first stage 3 to maintain the above set state.

Subsequently, "application of adhesive" is performed (step 1202).

Figure 7A:
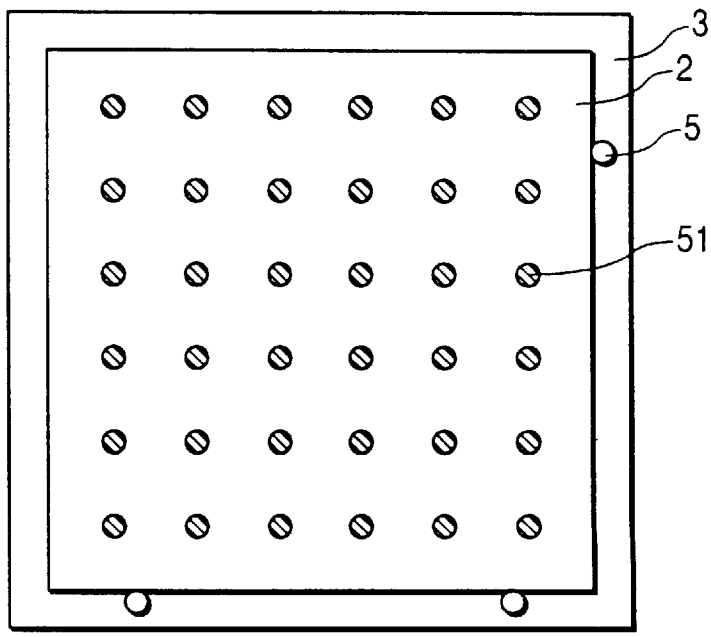
Figure 7B:
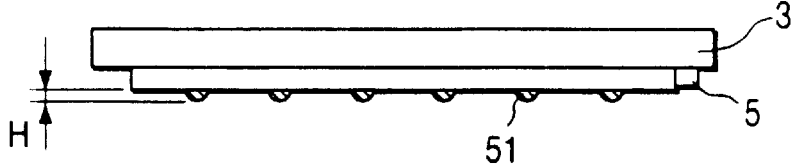

As shown in the schematic plan view of FIG. 7A and the schematic sectional view of FIG. 7B, the adhesive 51 is applied to the upper surface of the base 2 at 36 positions at predetermined intervals.

For example, about 0.05 g of the adhesive are applied to an adhesive height H=0.5 mm or more.

Details of Adhesive
type: photo-setting resin
viscosity: 20,000 cps
setting rate: 2,000 mj/cm$^2$ "Setting of substrate" is performed (step 1203). The above "setting of base" step 1201 may be performed concurrently with the "application of adhesive" step 1202.

Figure 8A:
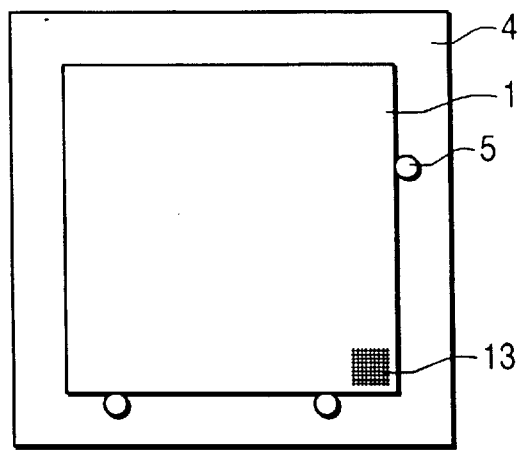
Figure 8B:
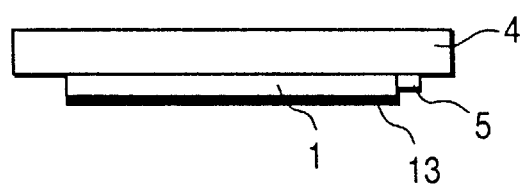

FIG. 8A is a schematic plan view showing a state in which the substrate 1 is set on a second stage 4. FIG. 8B is a schematic sectional view of the structure shown in FIG. 8A. The substrate 1 is set on the second stage 4 in contact with three positioning pins 5 mounted on the second stage 4. At this time, the lower surface of the substrate 1 is vacuum-chucked by the second stage 4 to maintain the above set state. Note that a portion 13 schematically shows a portion of the photoelectric conversion element matrix.

"Chucking of substrate" is performed (step 1204).

FIGS. 9A to 10B show a state in which the substrate 1 is vacuum-chucked by a vacuum plate 6 or vacuum pads 7 from the second stage 4.

Figure 9A:
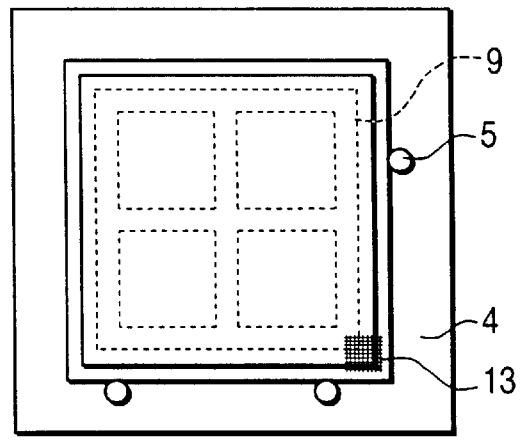
Figure 9B:
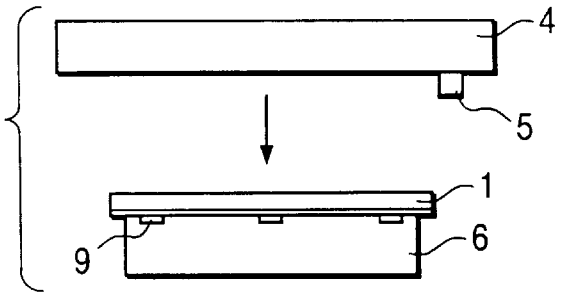
Figure 10A:
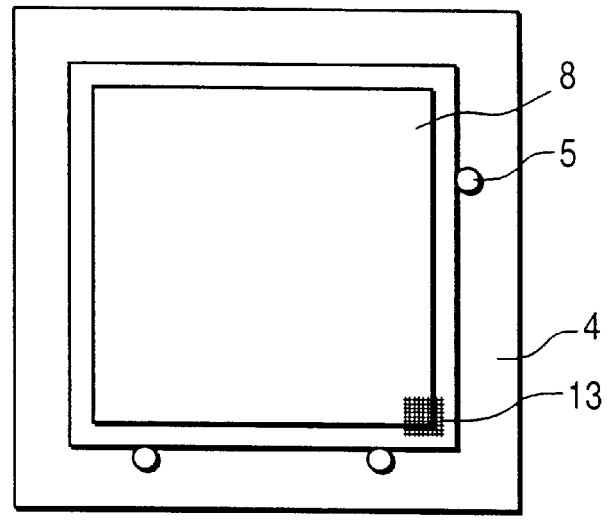
Figure 10B:
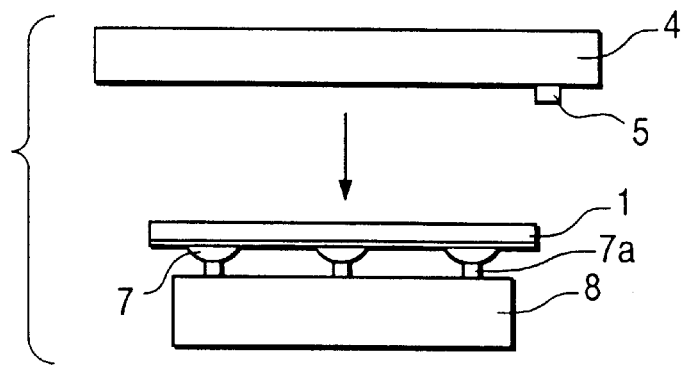

FIGS. 9A and 10A are schematic plan views. FIGS. 9B and 10B are schematic sectional views.

As shown in FIGS. 9A and 9B, the vacuum plate 6 is obtained by forming a groove 9 in the surface of a base member, and also forming a suction hole (not shown) communicating with the groove 9. The suction hole communicates with a suction means such as a pump (not shown) so that a gas such as air in the groove 9 can be drawn upon operation of the suction means.

The groove 9 formation surface of the vacuum plate 6 is brought into contact with the substrate 1, and the air in the space between the groove 9 and the substrate 1 is drawn by the suction means. As a result, the vacuum plate 6 is chucked to the substrate 1.

The shape of the groove 9 or the shape of the recess portion of the groove 9 may be changed as needed.

The vacuum pad 7 is a flexible pad mounted on the distal end of a pipe 7a connected to a pad plate 8. The vacuum pad 7 is commonly mounted as an elastic member around an opening of the pipe 7a. The vacuum pad 7 is used to prevent damage to the substrate 1 when the pipe 7a comes into contact with the substrate 1, and serves to prevent vacuum leakage so as to allow a suction means such as a pump (not shown) connected to the pipe 7a to efficiently draw air.

The arrangement of the vacuum pads 7 can be properly determined in consideration of chucking force required, the size of each substrate, and the like.

The vacuum plate 6 and the vacuum pads 7 come into contact with the element portion as the upper surface of each substrate 1. For this reason, in order to prevent damage or suppress vacuum leakage, a surface treatment such as Teflon coating is preferably performed for at least the surface of a portion, of the base member (e.g., an aluminum member) of the vacuum plate 6, which comes into contact with the substrate 1. For the same purpose, each vacuum pad 7 is preferably made of a rubber material.

As is apparent, the suction means is not limited to the above means, and can be modified, as needed.

Subsequently, "positioning of substrate" is performed (step 1205).

Figure 11A:
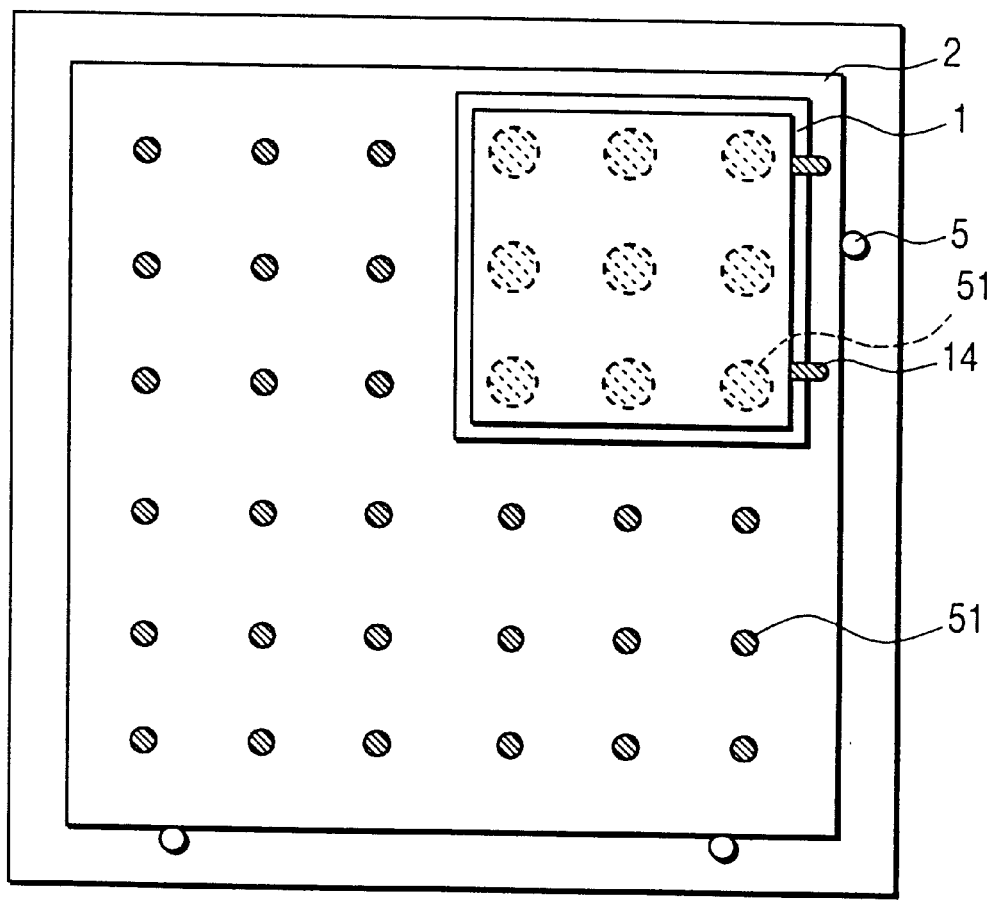
Figure 11B:
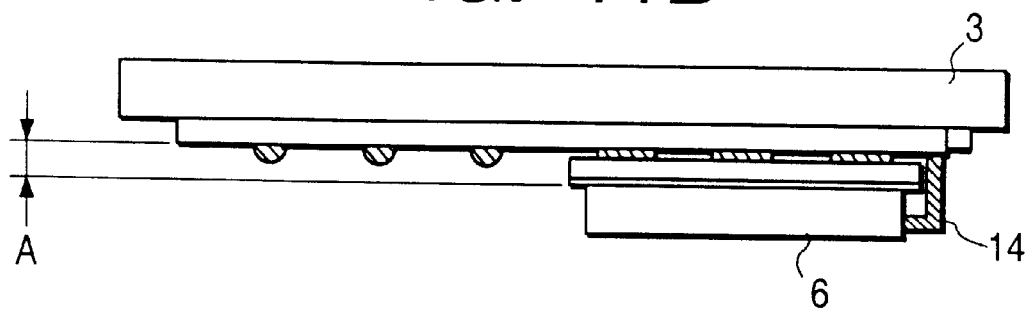

FIG. 11A is a schematic view showing a case in which the first substrate 1 is conveyed from the second stage 4 by the vacuum plate 6 and positioned to a predetermined place on the base 2 on the first stage 3. FIG. 11B is a schematic sectional view of the structure shown in FIG. 11A. At this time, a distance A (reference level) from the upper surface of the base 2 to the element surface of the substrate 1 is made constant in accordance with the protrusion amount of each stopper pin 14 as a jig mounted on the vacuum plate 6.

Assume that the reference level A is 1.3 mm if the thicknesses $T_1$ and $T_2$ of the substrates 1 are 1.1±0.1 mm, and the maximum variation in thickness is 0.2 mm. The thicknesses $t_1$ and $t_2$ of the adhesive are determined in accordance with variations in the thicknesses of the substrates 1, as follows:

$$A=T_1+t_1$$

$$A=T_2+t_2$$

"Hardening of adhesive" is performed (step 1206).

Figure 12A:
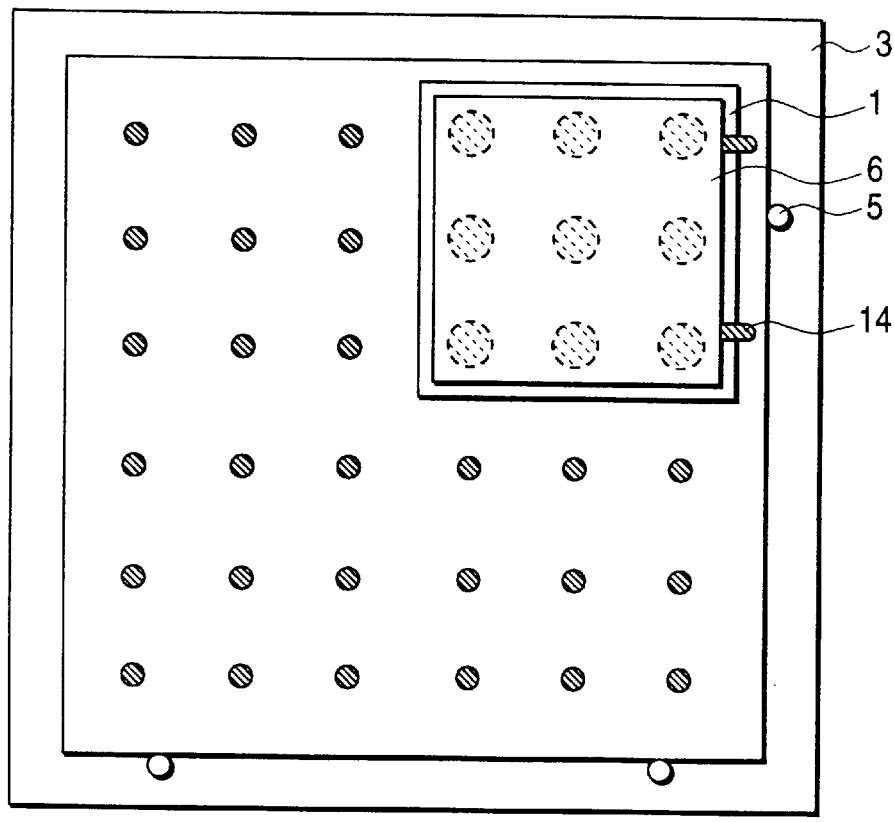
Figure 12B:
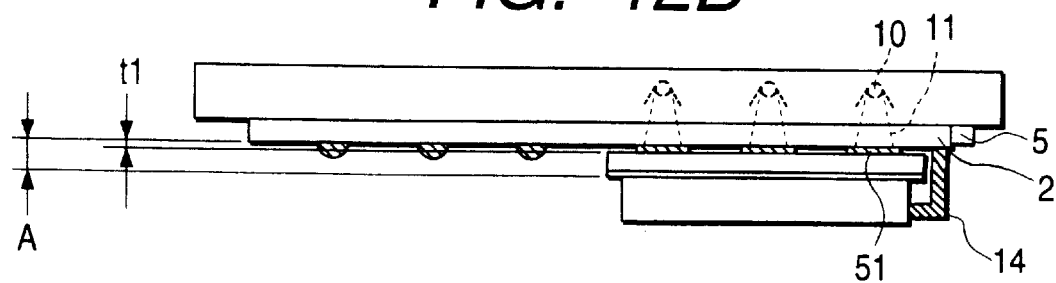

FIG. 12A is a schematic plan view for explaining a case in which the adhesive 51 is hardened by being irradiated with UV light 11 emitted from a UV light source 10. FIG. 12B is a schematic sectional view of the structure shown in FIG. 12A.

In order to maintain the level (reference level) A from the base 2, the adhesive 51 on the substrates 1 is hardened with the thickness $t_1$ of the adhesive being held. As is apparent, the light source 10 is not limited to a UV light source, and other sources can be properly selected in accordance with the type of adhesive to be used. The adhesive is preferably hardened by using UV light because no thermal problems are posed. However, other hardening methods may be selected in accordance with the type of adhesive to be used. As is apparent, if a photo-setting adhesive is not used, no UV irradiation is required. For example, a two-part adhesive may be used to hold substrates temporarily for only a predetermined period of time. As is apparent, in this case, the adhesive is applied to only necessary portions.

Next, "release chucking of substrate" is performed (step 1207).

Figure 13A:
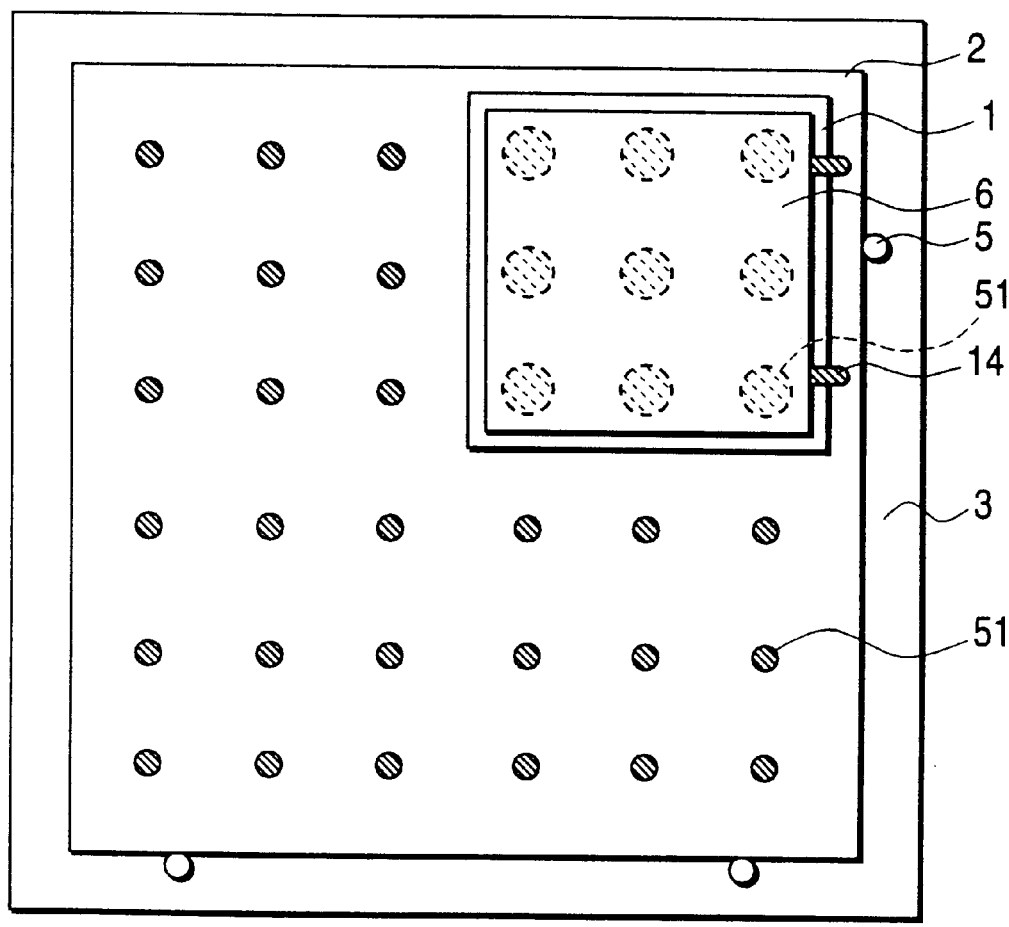
Figure 13B:
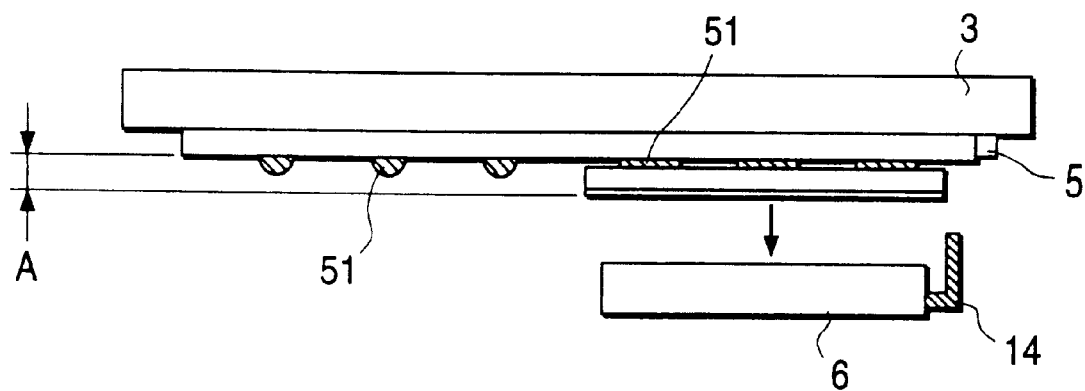

FIG. 13A is a schematic plan view for explaining a case in which vacuum-chucking of the vacuum plate 6 is released after the adhesive 51 on the lower surface of the substrate 1 is hardened, and it is confirmed that the level (reference level) A from the upper surface of the substrate 1 to the base 2 is maintained. FIG. 13B is a schematic sectional view of the structure shown in FIG. 13A.

The process including the above "setting of substrate" step and the subsequent steps is repeated to bond the second and subsequent substrates 1. In this case, the same operation as described above is repeated three more times to bond the four substrates 1, thereby terminating the process.

[Second Embodiment]

Figure 14A:
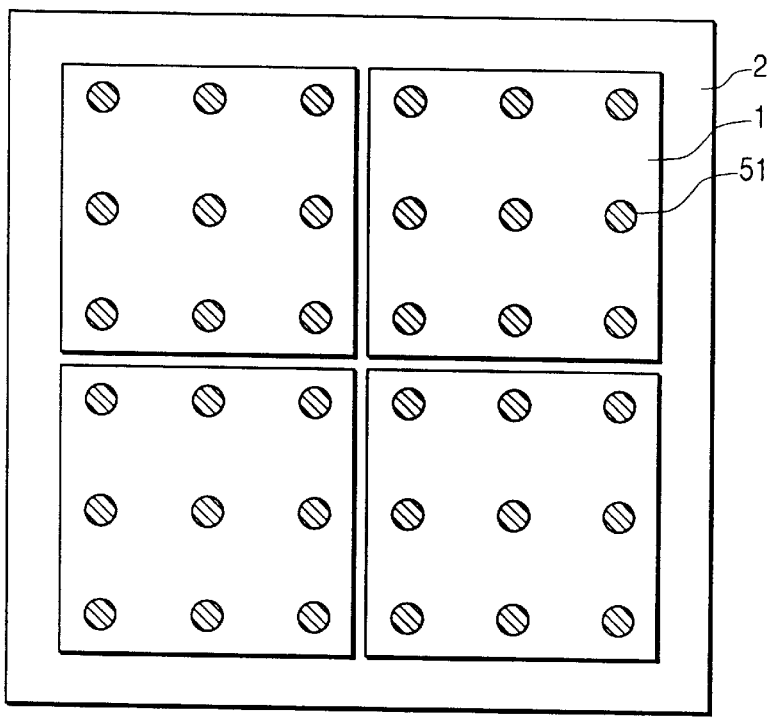
Figure 14B:
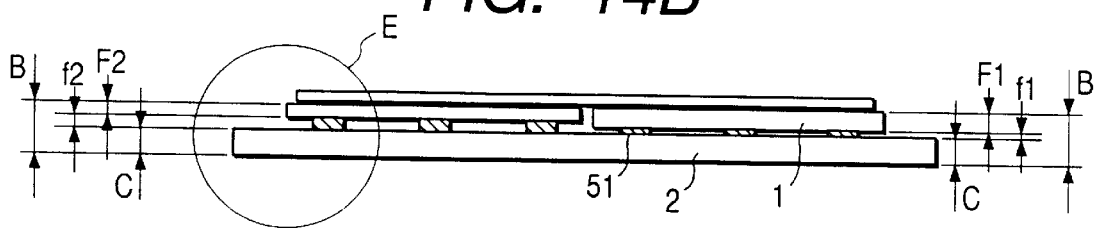
Figure 15:
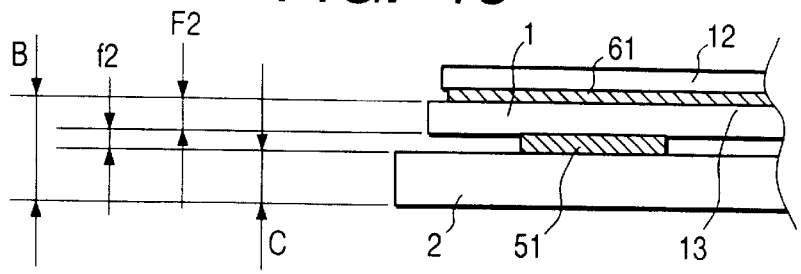
FIG. 15 is an enlarged schematic sectional view of the portion indicated by a circle E in FIG. 14B.

FIG. 14A is a schematic plan view showing a photoelectric conversion apparatus according to another embodiment of the present invention. FIG. 14B is a schematic sectional view of the structure shown in FIG. 14A. FIG. 15 is an enlarged view of a portion E in FIG. 14B. Referring to FIGS. 14A and 14B, this apparatus includes a plurality of substrates 1 having semiconductor elements 13 formed on their upper surfaces, and a base 2 to which the substrates 1 are fixed. An adhesive 51 is used to bond the substrates 1 to the base 2. A wavelength conversion member 12 typified by a phosphor for converting light having a short wavelength into visible light is bonded to the substrates 1 using an adhesive 61. The photoelectric conversion apparatus of the second embodiment is constituted by these components.

As shown in FIG. 14B, the substrates 1 in this embodiment have different thicknesses F1 and F2. However, the levels of the substrates 1 are adjusted by thicknesses f1 and f2 of the adhesive 51 such that the thickness of the overall structure including the base 2 is uniformly set to be a thickness B.

$$F1+f1+C=B$$

$$F2+f2+C=B$$

where C is the thickness of the base 2.

Although not shown, if the thicknesses of the third and fourth substrates 1 and the thicknesses of the adhesive layers are defined as F3, F4, f3, and f4, similar relations must hold.

A method of mounting substrates according to this embodiment will be described with reference to the flow chart in FIG. 16 and FIGS. 17A to 20B. FIGS. 17A and 17B, 18A and 18B, 19A and 19B, and 20A and 20B are schematic plan views and schematic side views, respectively. Referring to FIGS. 17A to 20B, a third stage 103 is used to fix the base 2, and four first stages 104 are used to align a plurality of substrates 1. A second stage 106 is used to convey the substrates 1 with their element surface sides set on the same plane. Positioning pins 105 are formed on the third stage 103. Spacers 114 are used to control the gap between the third stage 103 and the second stage 106. Suction holes 115 are formed in the third stage 103. Positioning pins 109 are formed on the first stages 104. Suction holes 116 are formed in the first stages 104. Although not shown, suction holes are also formed in the lower portion side of the second stage 106. The first, second, and third stages shown in FIG. 16 correspond to the stages 104, 106, and 103 in FIGS. 17A to 20B.

Figure 16:
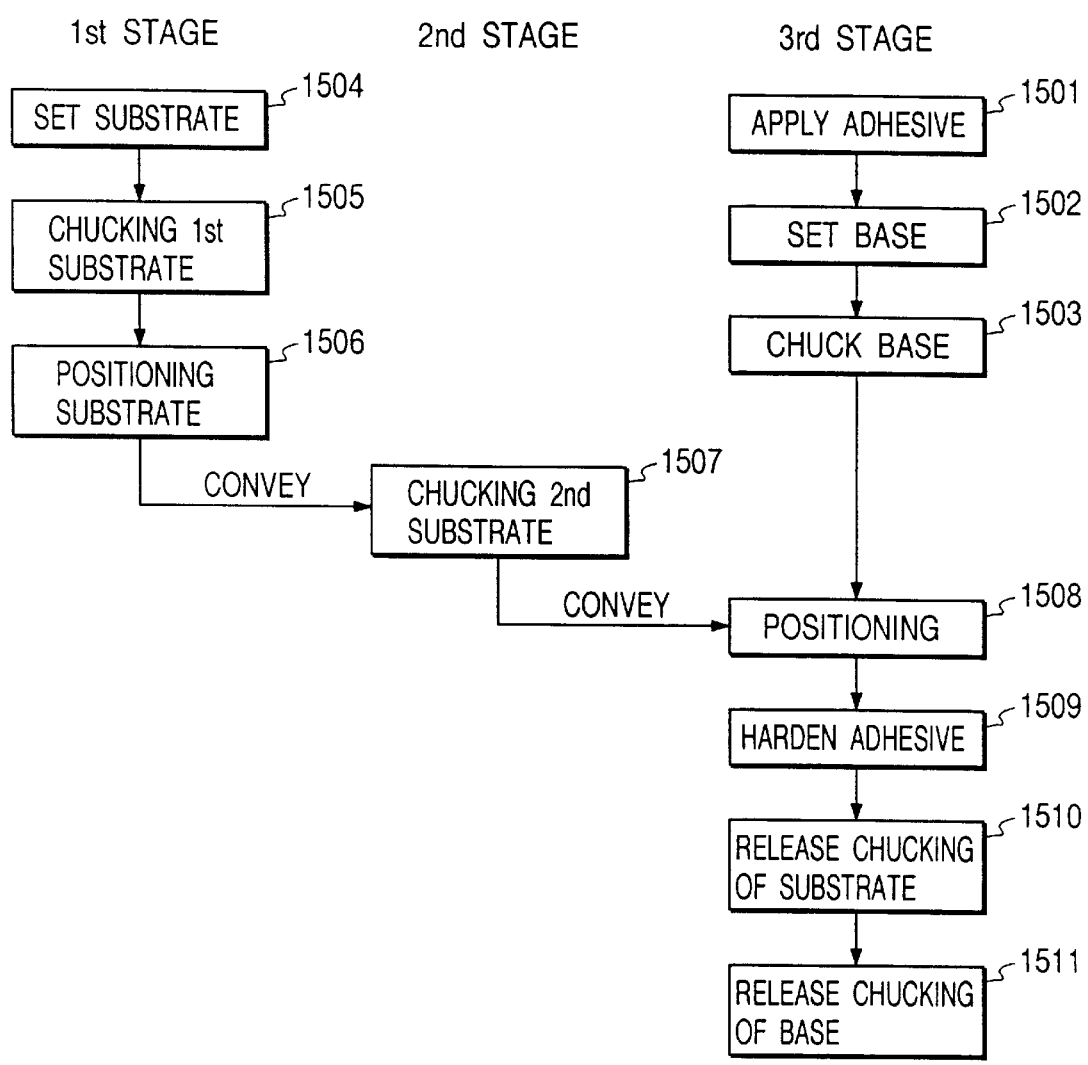

FIGS. 17A and 17B are views for explaining the steps associated with the first stages and shown in FIG. 16, i.e., the step of setting a substrate on the first stage (step 1504), the step of chucking the first substrate (step 1505), and the step of positioning the substrate (step 1506). Each of the four substrates 1 is set on a corresponding one of the four first stages 104 by bringing each substrate into contact with the three positioning pins 109 (step 1504). At this time, the element surfaces of the substrates 1 are set to face up in FIG. 17B. Subsequently, in order to fix the substrate 1 on the first stage 104, air is drawn through the suction holes 116 (shown in FIG. 20A) in the first stage 104, thus chucking the first substrate (step 1505). Each of the first stages 104 can be moved in the X, Y, θ, and Z directions. Relative position alignment of the substrates 1 is performed by moving the first stages 104. If each substrate 1 needs to be aligned with a relative position precision of the order of mm or less, the operator may perform alignment while checking the pattern of each panel or alignment marks with a microscope. With this process, relative position alignment of the four substrates 1 on the first stages 104 is completed (step 1506).

FIGS. 18A and 18B are views for explaining the steps associated with the third stage and shown in FIG. 16, i.e., the step of applying the adhesive (step 1501), the step of setting the base (step 1502), and the step of chucking the base (step 1503). The adhesive 51 is applied to the base 2 with an adhesive coating unit (e.g., a dispenser) (step 1501). For example, the apparatus shown in FIGS. 18A and 18B may incorporate a dispenser to apply the adhesive. Although FIGS. 18A and 18B show a state in which the adhesive is applied to 36 points on the base 2, the adhesive may be applied in the form of lines or on the entire surface of the base depending on the conditions required. In order to set the element upper surface sides of the four substrates 1 as flat as possible, an adhesive exhibiting minimum expansion/contraction upon hardening is preferably used. In addition, in order to suppress the influences of deformation with a change in temperature, a photo-setting adhesive or a cold-setting adhesive including a two-part adhesive (prime agent and curing agent) typified by an epoxy-based adhesive is preferably used. The base 2 coated with the adhesive 51 in this manner is set on the third stage 103 after being brought into contact with the three positioning pins 105 mounted on the third stage 103 (step 1502). In order to fix the base 2 on the third stage 103, the lower surface of the base 2 is drawn by suction through the suction holes 115 (shown in FIG. 17A) in the third stage 103, thus chucking the base 2 (step 1503).

FIGS. 19A and 19B show the step of chucking the second substrate on the second stage in FIG. 16. In order to chuck the aligned substrate 1, the second stage 106 moves over the first stages 104, and is lowered to a position immediately before it comes into contact with the substrate 1. Thereafter, air is drawn through the suction holes (not shown) formed in the lower surface of the second stage 106, and the suction pressure is monitored. The first stage 104 is slowly raised. When the pressure monitored at the moment when the first stage 104 comes into contact with the second stage 106 becomes a predetermined pressure or less, the first stage 104 is stopped, and the chucking operation is also stopped. With this operation, the substrate 1 can be smoothly transferred from the first stage 104 to the second stage 106 without causing any positional offset and damage, thus completing chucking of the substrate onto the second stage 106 (step 1507). Since this apparatus uses one second stage for four first stages, the suction portions of the second stage 106 are preferably divided into four systems to be switched in correspondence with the respective substrates. In addition, since the thicknesses of the substrates 1 vary, the above process is preferably performed for each first stage 104 sequentially.

FIGS. 20A and 20B are views for explaining the steps associated with the third stage and shown in FIG. 16, i.e., the step of positioning a substrate (step 1508), the step of hardening the adhesive (step 1509), the step of releasing chucking of the substrate (step 1510), and the step of releasing chucking of the base (step 1511). After the second stage 106 chucking the four substrates 1 moves over the third stage 103 to bond the substrates 1 to the base 2, the second stage 106 is lowered, and the gap between the second stage 106 and the third stage 103 is fixed to the height of each positioning spacer 114. The height of each spacer 114 is designed such that the gap between the third stage 103 and the second stage 106 becomes the thickness B in FIG. 14B. The base 2 and the substrates 1 may be aligned in the planar direction by fitting the protruding portions of the spacers 114 in alignment holes (not shown) formed in the second stage 106. The lower surface of the base 2 and the element surface sides of the substrates 1 are kept drawn to each other until the adhesive 51 is hardened, as shown in FIG. 20B. With this operation, positional shifts between the substrates 1 and the base 2 can be suppressed until the adhesive 51 hardens. Finally, the chucking operation of the second stage 106 is stopped, and the second stage 106 is raised. As a result, the substrates 1 and the base 2 are left on the third stage 103 in a chucked state. When the sucking operation of the third stage 103 is stopped, the substrates 1 and the base 2 can be removed from the apparatus.

As described above, the semiconductor element surfaces of four substrates are vacuum-chucked within the same plane, and the base surface is vacuum-chucked within another plane. The distance between the two planes is kept constant until the adhesive hardens. With this operation, as shown in FIG. 14B, the element surfaces are bonded to the base surface in accordance with the design dimensions, and the levels of the element surfaces of the respective substrates are adjusted by the thicknesses f1 and f2 of the adhesive.

[Third Embodiment]

Figure 21:
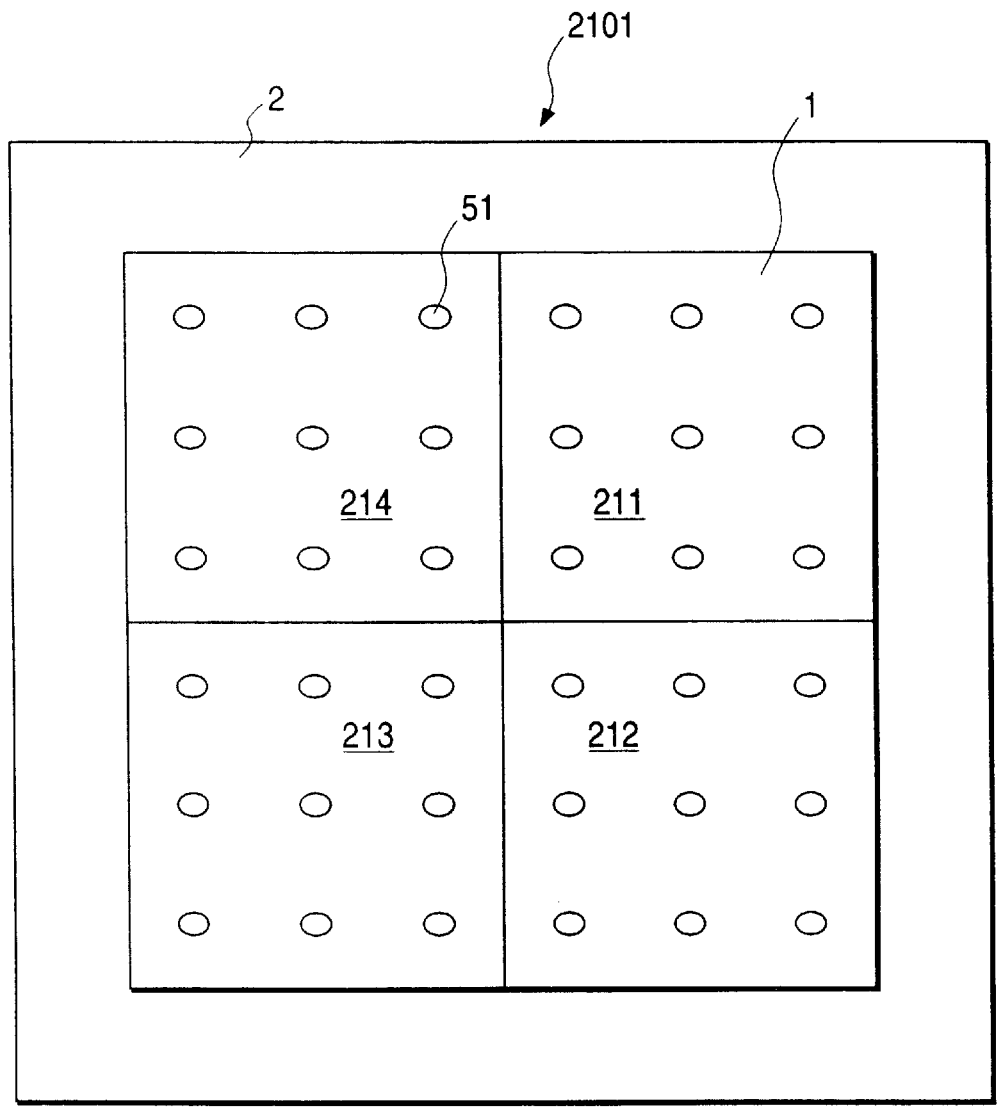
FIGS. 21 and 22, and 25 and 26 are respectively schematic plan views and schematic sectional views each for explaining a preferred example of the photoelectric conversion apparatus of the present invention.
Figure 22:
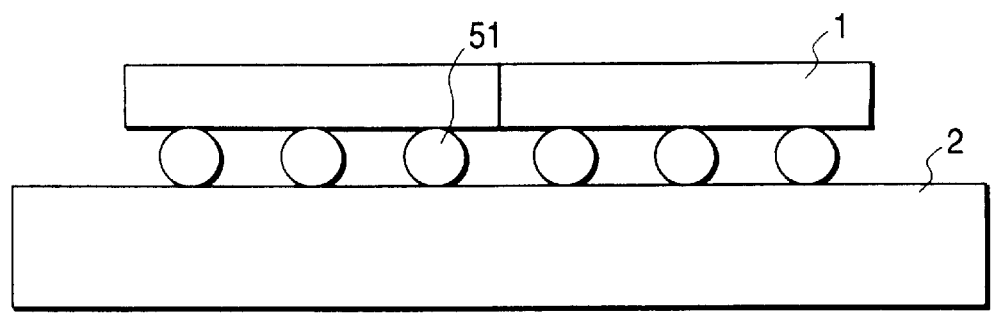

FIG. 21 is a schematic plan view showing a photoelectric conversion apparatus according to the present invention. FIG. 22 is a schematic sectional view of the photoelectric conversion apparatus in FIG. 21.

As shown in FIG. 21, four substrates 211, 212, 213, and 214 on which arrays of photoelectric conversion elements are mounted are bonded to a base 2 at predetermined intervals (not shown) with an adhesive 51 such as a silicone-based adhesive, thereby forming one large photoelectric conversion apparatus 2101.

The photoelectric conversion apparatus 2101 is obtained by two-dimensionally arranging a plurality of photoelectric conversion elements on the four substrates 211, 212, 213, and 214 at equal intervals so as to form a so-called contact type sensor for reading an image of an information source through a one-to-one optical system, as described above. On each substrate, a photoelectric conversion semiconductor layer and a TFT semiconductor layer are formed at once. As described above, with the development in photoelectric conversion semiconductor materials typified by a-Si, photoelectric conversion elements and thin-film field effect transistors can be formed on a large-area substrate (e.g., a glass substrate). Each of the substrates 211, 212, 213, and 214 can be manufactured by such a technique.

In the photoelectric conversion apparatus shown in FIG. 21, when the ambient environmental temperature or the like changes, the difference in thermal expansion coefficient between the substrates, on which photoelectric conversion elements are mounted, and the base, to which the substrates are to be bonded, produces a force which acts to cause a variation in the space between the adjacent substrates. If, however, an elastic material such as a silicone adhesive is used as the adhesive 51, the force is absorbed by the elasticity of the adhesive resin. For this reason, the spaces between the bonded substrates can be kept constant regardless of changes in ambient environmental temperature and the like.

If substrates and a base are made of the same material, there is no thermal expansion coefficient difference. If, however, a thermosetting resin is used, cracks and the like may form on the interface between the substrate and the resin or between the base and the resin with changes in ambient environmental temperature because of the difference in thermal expansion coefficient between the substrate and the resin or between the base and the resin. For this reason, even if substrates and a base are made of the same material, an elastic material such as a silicone-based adhesive is preferably used. As a method of adjusting the thickness of the structure including the adhesive, either of the positioning methods in the first and second embodiments can be used.

[Fourth Embodiment]

Figure 23:
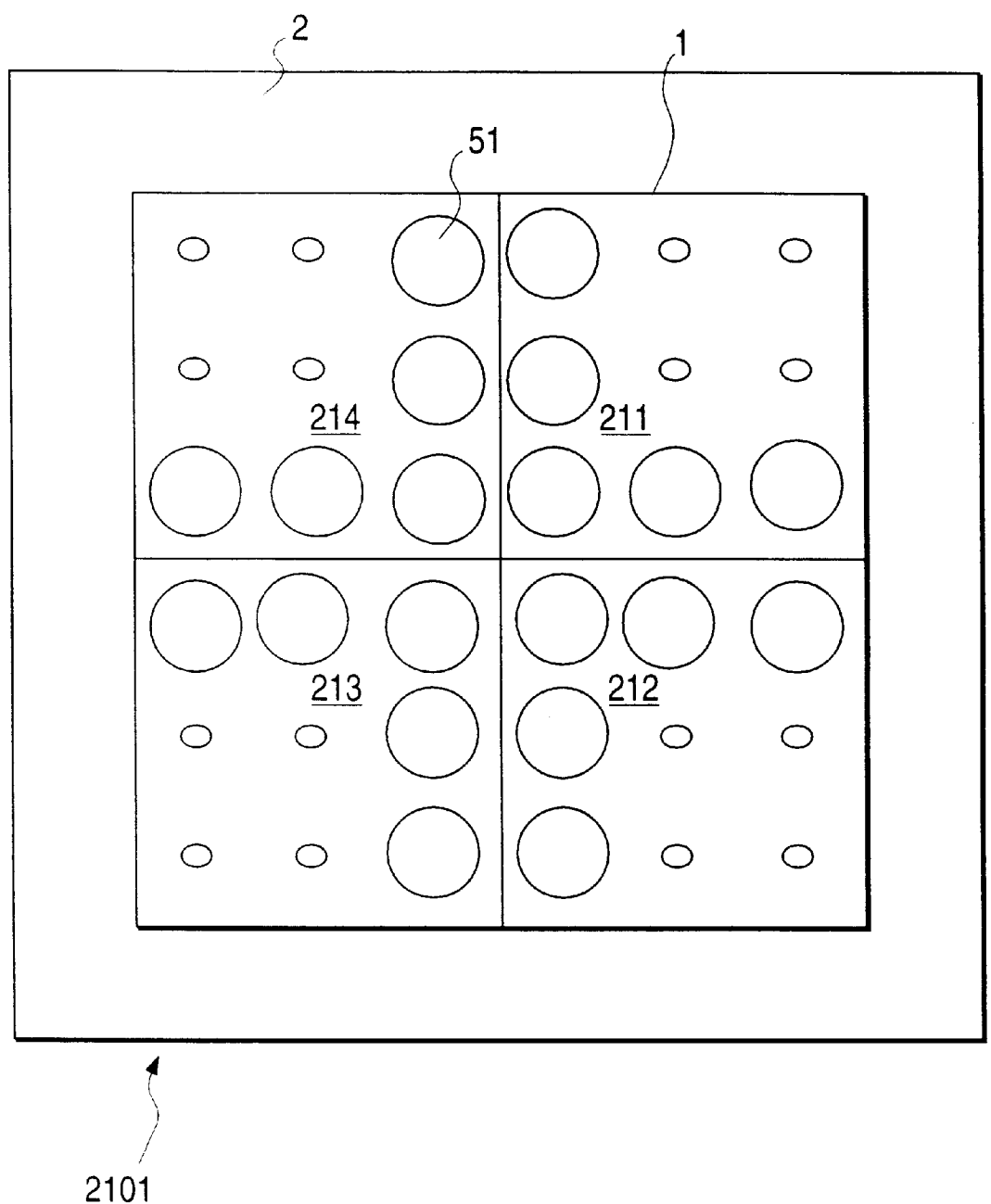

FIG. 23 is a schematic plan view showing another photoelectric conversion apparatus according to the present invention.

As shown in FIG. 23, in this embodiment, similar to the third embodiment, four substrates 211, 212, 213, and 214 on which arrays of photoelectric conversion elements are mounted are bonded to a base 2 at predetermined intervals with an adhesive 51 such as a silicone-based adhesive, thereby forming one large photoelectric conversion apparatus 2101. Even if the difference in thermal expansion coefficient between the substrates, on which the photoelectric conversion elements are mounted, and the base, to which the substrates are bonded, produces a force which acts to cause a variation in the space between the adjacent substrates, since an elastic material such as a silicone-based adhesive is used, the force is absorbed by the elasticity of the adhesive resin.

In this embodiment, as shown in FIG. 23, the coating weight of the adhesive on the adjacent portions of the adjacent substrates is larger than that on the remaining portions. For this reason, the bonding area between the adjacent portions of the substrates and the base becomes large, and the resistance to the force produced by the thermal expansion coefficient difference increases, thereby realizing a structure in which variations in the spaces between the substrates can be suppressed.

[Fifth Embodiment]

Figure 24:
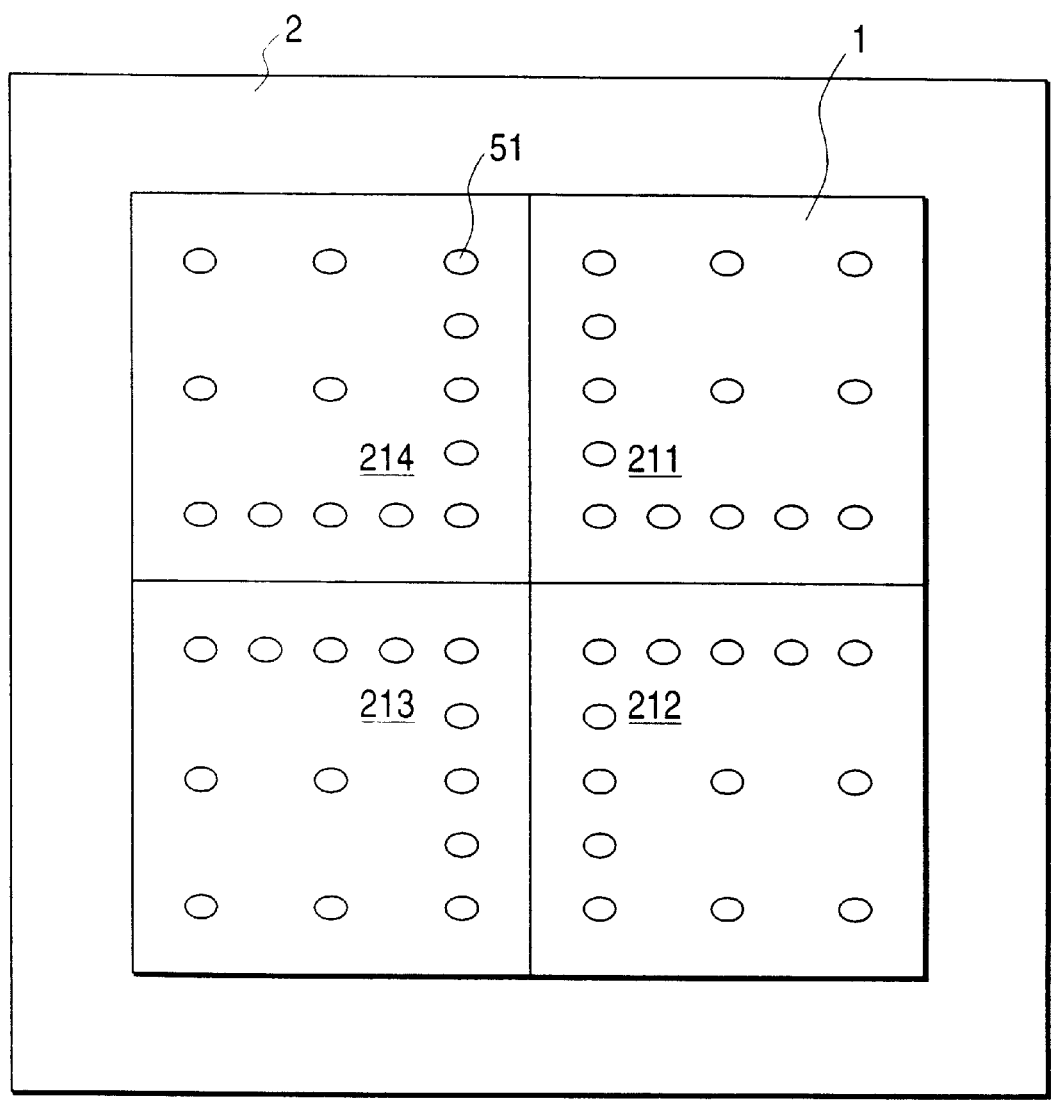

FIG. 24 is a schematic plan view showing a photoelectric conversion apparatus according to still another preferred embodiment of the present invention.

Similar to the fourth embodiment shown in FIG. 23, in the photoelectric conversion apparatus of this embodiment, the bonding area between the adjacent portions of adjacent substrates and a base is set to be large so as to be resistant to a force produced by a thermal expansion coefficient difference. In this embodiment, however, as shown in FIG. 24, the bonding area is increased by setting a larger number of application portions of an adhesive resin on the adjacent portion of the adjacent substrates than in the remaining regions. For this reason, similar to the fourth embodiment, a structure in which variations in the spaces between the substrates can be suppressed more is realized.

[Sixth Embodiment]

Figure 25:
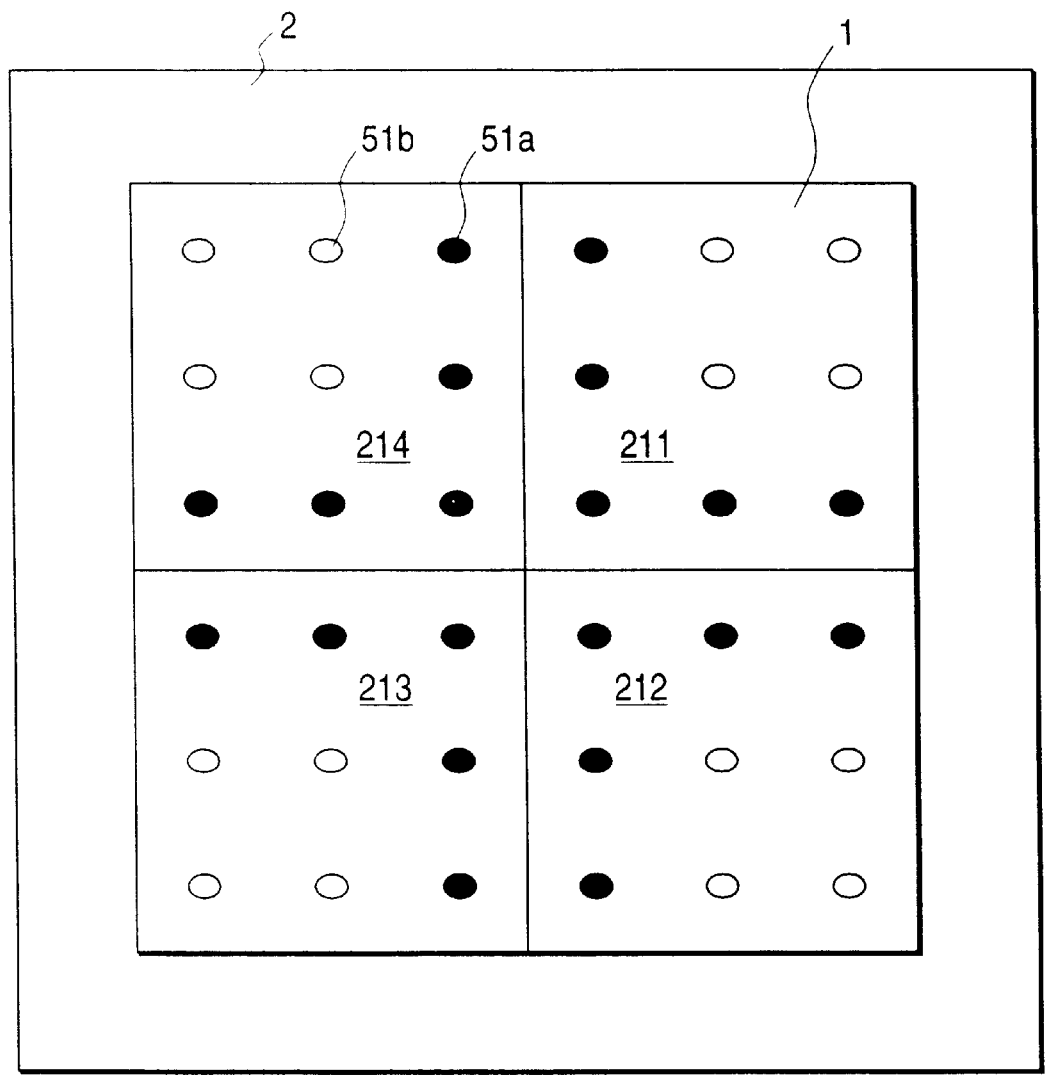
Figure 26:
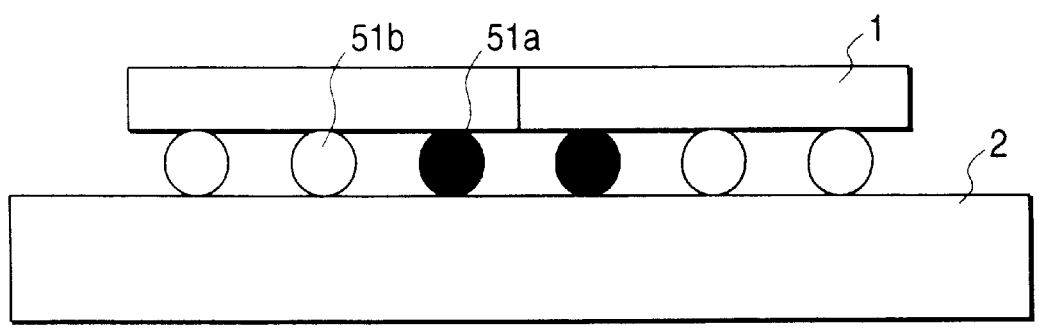

Still another embodiment of the present invention will be described below with reference to FIGS. 25 and 26. FIG. 25 is a schematic plan view for explaining a photoelectric conversion apparatus constituted by four substrates 1, each having a plurality of photoelectric conversion elements, which are bonded to a base 2 with adhesives 51a and 51b. FIG. 26 is a schematic sectional view of this apparatus.

This embodiment uses the adhesives 51a and 51b having different properties to bond the substrates 1 to the base 2. In this embodiment, the adhesive 51b is more elastic than the adhesive 51a.

More specifically, as the elastic adhesive 51b, a silicone-based adhesive like the one described above is used. As the less elastic adhesive 51a, for example, an epoxy-based adhesive can be used.

In this embodiment, the less elastic adhesive 51a is applied along the adjacent sides of the respective substrates 1, and the elastic adhesive 51b is applied to the remaining portions. That is, in this embodiment, the adhesive 51a is used as a fixing adhesive, and the adhesive 51b is used as a semi-fixing adhesive.

According to this embodiment, since the less elastic adhesive as the fixing adhesive is applied to the adjacent portions of the adjacent substrates to fix them, movement of the joint portions of the substrates can be neglected even if the environmental temperature changes. Therefore, the resultant image exhibits higher quality.

[Seventh Embodiment]

Figure 27:
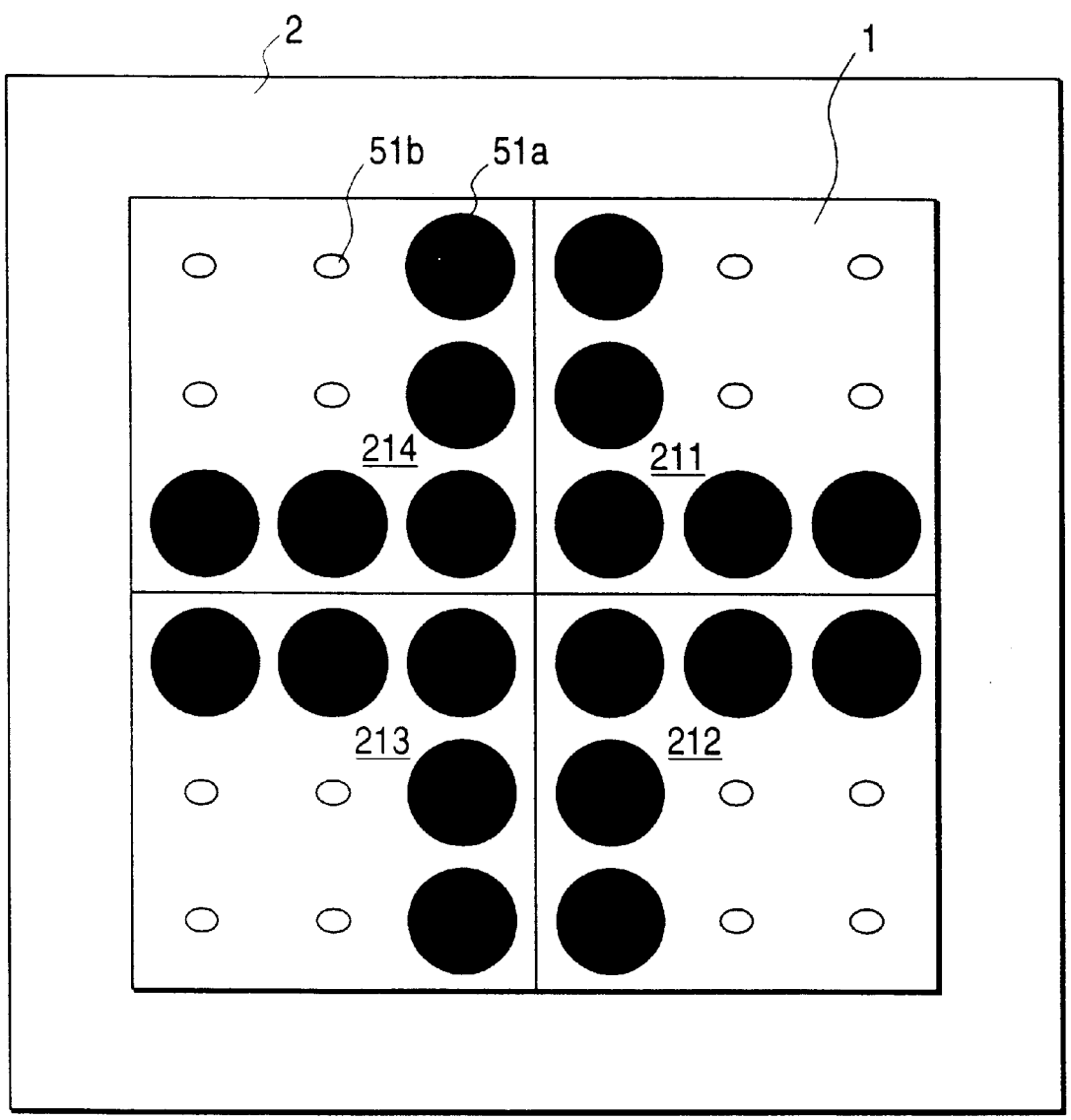

FIG. 27 is a schematic plan view for explaining the seventh embodiment of the present invention.

Similar to the sixth embodiment, this embodiment uses adhesives 51a and 51b having different properties. In addition, similar to the sixth embodiment, in this embodiment, the adhesive 51a having no or low elasticity is applied along the adjacent sides of adjacent substrates.

In this embodiment, however, the coating weight of the adhesive 51a is set to be large to increase the boding area.

With this structure, the substrates can be more firmly fixed to the base. In addition, thermal problems such as thermal expansion can be solved by the elastic adhesive 51a in the same manner as described above.

[Eighth Embodiment]

Figure 28:
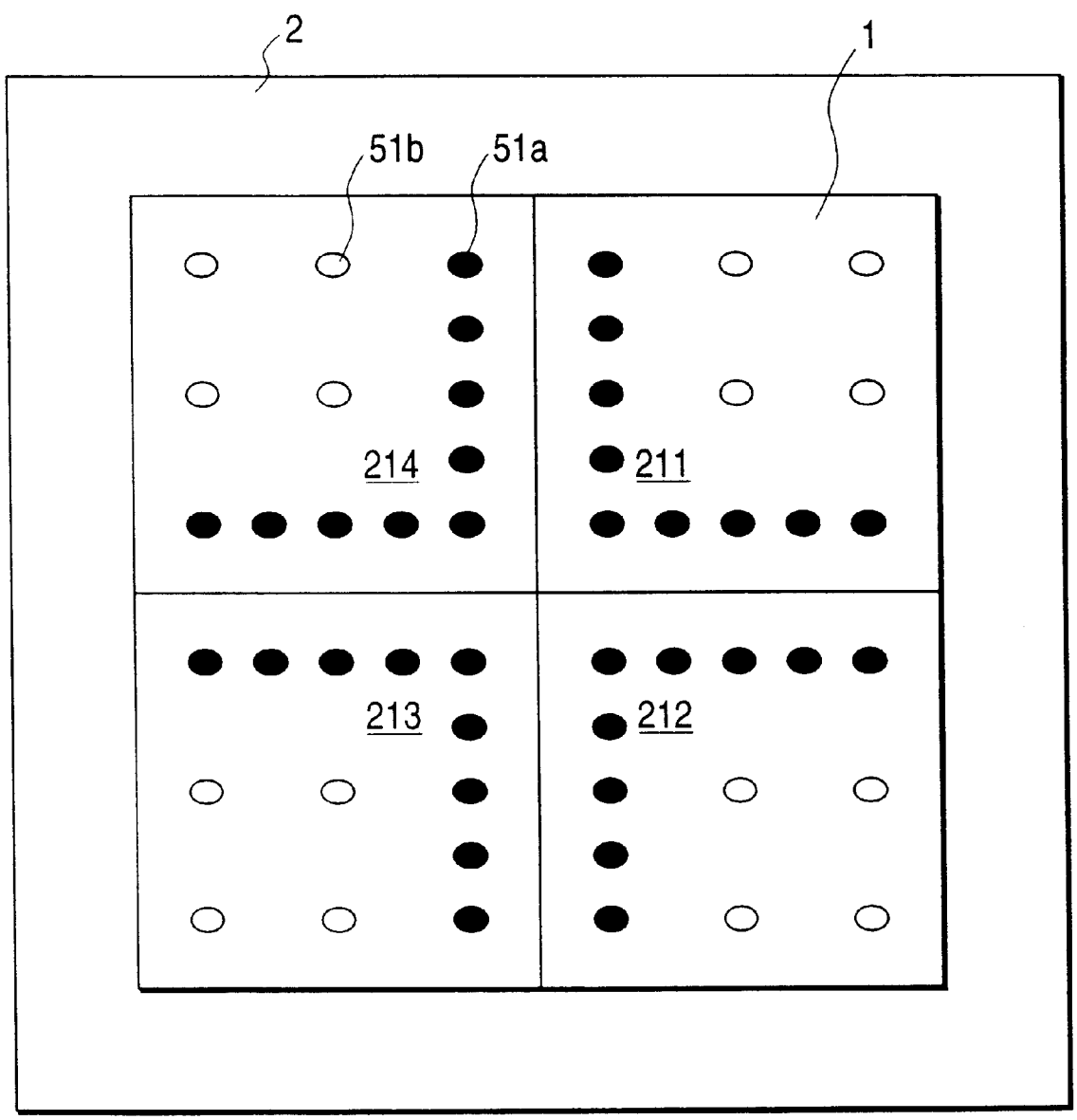

FIG. 28 is a schematic plan view for explaining the eighth embodiment of the present invention.

As shown in FIG. 28, in this embodiment, the number of application spots of an adhesive 51a having no or low elasticity along the adjacent sides of adjacent substrates is set to be large. Relative positioning of the substrates can be ensured by this application method regardless of changes in environmental temperature.

[Ninth Embodiment]

FIG. 29 is a schematic plan view for explaining the ninth embodiment of the present invention.

As shown in FIG. 29, in this embodiment, an adhesive 51a having no or low elasticity is applied in the form of lines along the adjacent sides of adjacent substrates.

In this case as well, relative positioning of the substrates can be ensured regardless of changes in environmental temperature.

[Tenth Embodiment]

An X-ray apparatus using the above photoelectric conversion apparatus will be described next.

Figure 30A:
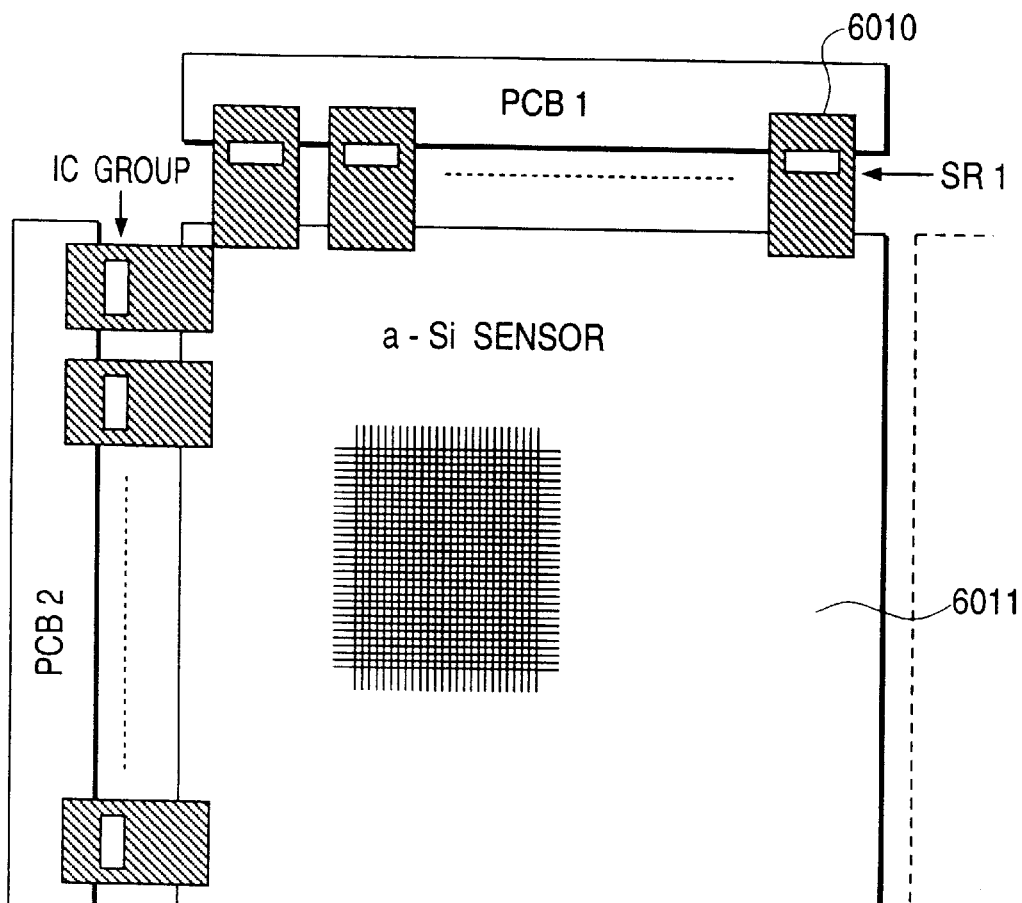
FIG. 30A is a schematic partial plan view showing a preferred example of the photoelectric conversion unit and its peripheral unit of an X-ray apparatus.
Figure 30B:
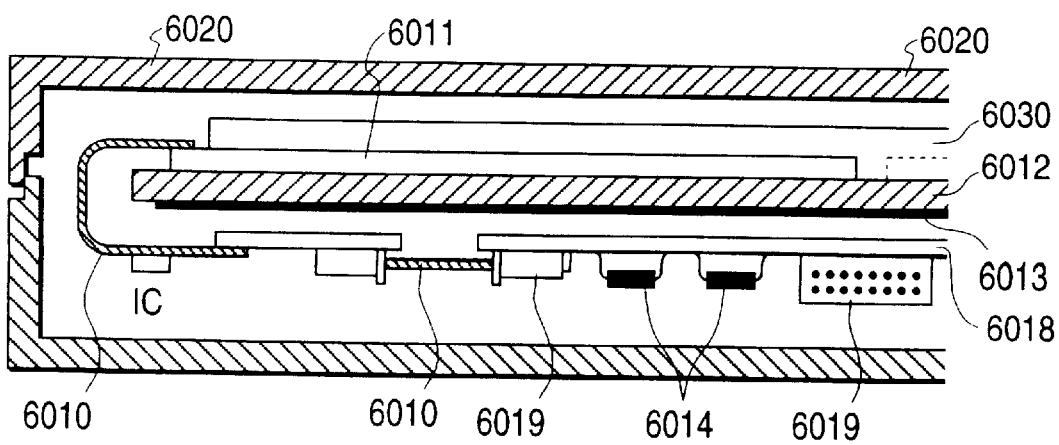
FIG. 30B is a schematic partial sectional view of the structure in FIG. 30A.

FIG. 30A is a schematic plan view showing the photoelectric conversion unit and peripheral signal processing unit of the X-ray apparatus. FIG. 30B is a schematic sectional view showing the detailed arrangement of the photoelectric conversion unit and the peripheral signal processing unit.

Referring to FIGS. 30A and 30B, the X-ray apparatus includes a-Si sensor substrates 6011, a base member 6012 to which the a-Si sensor substrates 6011 are bonded, a plate 6013 for blocking X-rays, a phosphor 6030 formed on the a-Si sensor substrates 6011, flexible boards 6010 connected to the a-Si sensor substrates 6011, circuit boards 6018 on which peripheral signal processing circuits are mounted, a connector 6019, resistors 6014, and a housing 6020 in which these members are housed. The a-Si sensor substrates 6011 are bonded to the base member 6012 with an elastic material such as a silicone-based adhesive like the one described in the above embodiments, and the spaces between the a-Si sensor substrates 6011 are kept uniform regardless of changes in ambient environmental temperature.

Figure 31:
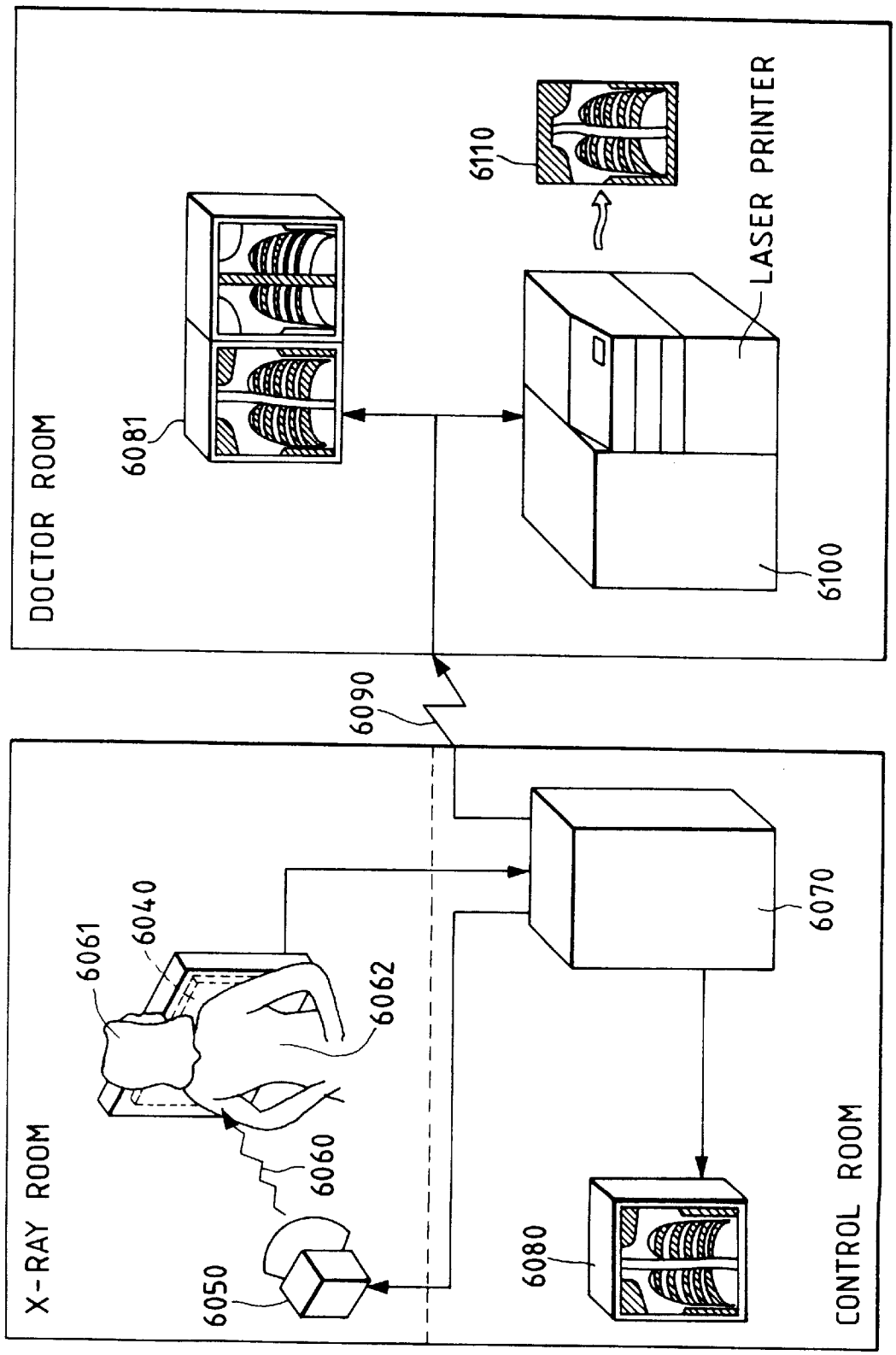
FIG. 31 is a schematic view for explaining a preferred example of an X-ray system having an X-ray apparatus to which the photoelectric conversion apparatus of the present invention can be applied.

FIG. 31 shows the arrangement of an examination system using the X-ray apparatus having the above photoelectric conversion apparatus. As shown in FIG. 31, this examination system includes an image sensor unit 6040, an X-ray tube 6050, an image processor 6070, and a display 6080, which are arranged in an X-ray room. The system also includes a display 6081 and a film processor 6100 having a laser printer, which are arranged in a doctor room.

When a person 6061 to be examined enters the X-ray room and moves such that a chest 6020 opposes the image sensor unit 6040, the X-ray tube 6050 operates in accordance with a control signal from the image processor 6070 to irradiate x-rays 6060. The irradiated X-rays pass through the chest and are converted into an optical signal and an electrical signal by the image sensor unit 6040. These signals are then transferred to the image processor 6070. The image processor 6070 generates an image signal corresponding to the chest, and sends it to the display 6080, thereby displaying an X-ray image of the chest. In addition, the image processor 6070 sends the image signal as an image signal 6090 to the doctor room.

In the doctor room, the image signal 6090 transferred from the X-ray room is sent to a display 6081 to display an X-ray image of the chest, and a film 6110 is produced, as needed, by a film processor 6100.

In this embodiment, since the base and the substrates are bonded to each other with the elastic adhesive, even if the temperature in the environment in which the photoelectric conversion apparatus is placed greatly and abruptly changes, formation of cracks in the adhesive and changes in the spaces between the respective substrates can be suppressed effectively as compared with a case wherein only an adhesive having no elasticity is used.

By using adhesives having different properties, e.g., an elastic adhesive and an adhesive having no or lower elasticity, a firm structure which is resistant to mechanical stress such as vibrations as well as thermal stress can be realized. This structure is therefore suitable for a vehicle such as a mobile system.

As is apparent, in the photoelectric conversion apparatuses of the third to ninth embodiments as well, the substrate levels are preferably adjusted and fixed by the processes described in the first and second embodiments.

[Technical Advantages]

As described above, according to the present invention, the following effects can be obtained.

According to the present invention, since the semiconductor element surfaces of a plurality of substrates exhibit no variation in level, no focus error occurs, and a decrease in resolution and a deterioration in sensitivity can be prevented.

Since a wavelength conversion member such as a phosphor is bonded within the same or substantially same plane with respect to a plurality of substrates, bonding of the wavelength conversion member is facilitated. In addition, the member does not easily peel off, and hence a highly reliably structure can be obtained.

According to the present invention, before substrates are mounted on a base, the respective substrates need not be processed to have the same thickness. An improvement in productivity and a reduction in cost can be attained.

In addition, according to the present invention, substrates are fixed to a base with a photo-setting adhesive while the distance (reference level) A from the upper surface of the base to the semiconductor element surface of each substrate is kept. With this process, the work time can be shortened, and a large number of stable products can be manufactured.

Furthermore, according to the present invention, when an ambient environmental temperature change or like occurs, a force produced by the difference in thermal expansion coefficient between a base and each substrate is absorbed by the elasticity of an adhesive resin, thereby suppressing variations in the spaces between the adjacent substrates and keeping the spaces between the adjacent substrates constant regardless of ambient environmental temperature changes or the like.

When photoelectric conversion elements are arranged on substrates at a predetermined pixel pitch, and the substrates are arranged at predetermined intervals corresponding to the pixel pitch, variations in the spaces between the substrates may appear as variations in pixel pitch in the whole photoelectric conversion apparatus. According to the present invention, however, since the spaces between the adjacent substrates are kept constat regardless of ambient environmental temperature changes or the like, variations in pixel pitch can be suppressed.

According to the present invention, the coating weight or the number of application spots of an adhesive resin on the adjacent portions of adjacent substrates is set to be larger than that in the remaining regions so as to increase the bonding area of the adjacent portions of the adjacent substrates, thereby more effectively suppressing variations in the spaces between the substrates.

According to the present invention, an adhesive having no or low elasticity is used as the adhesive on the above adjacent portions, and an adhesive having a different property, e.g., having elasticity, is used as the adhesive on the remaining portions, thereby suppressing variations in the spaces between the substrates, increasing the substrate surface position precision, and solving the problems arising from ambient environmental temperature changes.

According to the present invention, an adhesive having no or low elasticity is used as the adhesive on the above adjacent portions, and an adhesive having a different property, e.g., having elasticity, is used as the adhesive on the remaining portions. In addition, the coating weight of the adhesive on the adjacent portions or the bonding area thereof is set to be larger than the coating weight of the adhesive having the different property on the remaining portions or the bonding area thereof. Alternatively, the density of application spots (points) of the adhesive on the adjacent portions is set to be higher than that of the adhesive having the different property on the remaining portions. With this process, the resistance to vibrations can be further improved.

A transmission photographing apparatus typified by an X-ray apparatus (X-ray image pickup apparatus) using the photoelectric conversion apparatus of the present invention can be reduced in size, and can be easily mounted in a vehicle to be moved. In addition, digital processing or electrical processing of photographing data is facilitated.

As is apparent, the present invention is not limited to the above description and the embodiments, and the embodiments can be modified and combined, as needed, within the spirit and scope of the invention.

What is claimed is:

1. A manufacturing method for a photoelectric conversion apparatus having a two dimensional photoreceiving surface which includes a plurality of semiconductor element substrates on which a plurality of photoreceiving sections of photoelectric conversion elements are arranged two dimensionally; a base on which said plurality of semiconductor element substrates are arranged fixedly; and an adhesive for fixing said plurality of semiconductor element substrates to said base, wherein said adhesive has a variation in a thickness thereof so as to align in the same plane photoreceiving surface side levels of said photoelectric conversion elements of said semiconductor element substrates, which comprises the steps of:

(a) fixing said plurality of semiconductor element substrates so as to align, with a reference plane, sides on which said photoreceiving sections are formed;

(b) disposing, on said base through said adhesive, said semiconductor element substrates at a side opposite to the side on which said photoreceiving sections are formed; and (c) hardening said adhesive while maintaining a space between said reference plane and said base, wherein a first elastic modulus of said adhesive after hardening of a section at a side of which said plurality of semiconductor substrates are adjacent to each other is different from a second elastic modulus of said adhesive at a second section distant from the section at which said semiconductor substrates are adjacent to each other.

2. The method according to claim 1, wherein the space is maintained with a protrusion amount of a jig.

3. The method according to claim 1, wherein said adhesive has a photo-setting property.

4. The method according to claim 1, further comprising the step of irradiating light to harden said adhesive.

5. The method according to claim 1, wherein said adhesive is employed in a greater amount at a section of a side at which said plurality of semiconductor substrates are adjacent to each other.

6. The method according to claim 1, wherein plural kinds of said adhesive are employed.

7. The method according to claim 1, wherein the second elastic modulus is greater than the first elastic modulus.

8. The method according to claim 1, wherein said adhesive is employed in a line on a side at which said plurality of semiconductor substrates are adjacent to each other.

9. The method according to claim 1, wherein said adhesive is employed in a line on a section of a side at which said plurality of semiconductor substrates are adjacent to each other, and is employed in dots on a region distant from the section.

10. The method according to claim 1, wherein said space is maintained by a spacer.

11. The method according to claim 1, wherein said reference plane is provided with means for positioning said semiconductor substrates.

12. The method according to claim 11, wherein said means for positioning comprises a pin.

13. A manufacturing method for a photoelectric conversion apparatus having a two dimensional photoreceiving surface including a plurality of semiconductor element substrates on which a plurality of photoreceiving sections of photoelectric conversion elements are arranged two dimensionally, a base on which said plurality of semiconductor element substrates are disposed fixedly, and an adhesive for fixing said plurality of semiconductor element substrates to said base, wherein said adhesive has a variation in a thickness thereof so as to align, with the same plane, photoreceiving surface side levels of said photoelectric conversion elements of said semiconductor element substrates, which method comprises the steps of:

a) fixing one of said plurality of semiconductor element substrates so as to align, with a reference plane, a side on which the photoreceiving section is formed;

b) disposing said base through said adhesive on the semiconductor element substrate from step (a) at a side opposite to the side on which the photoreceiving section is formed; and c) hardening said adhesive keeping a space between said reference plane and said base; and d) repeating steps (a), (b) and (c) for the remainder of the plurality of semiconductor element substrates using the same reference plane as in step (a), wherein a first elastic modulus of said adhesive after hardening of a section at a side at which said plurality of semiconductor substrates are adjacent to each other is different from a second elastic modulus of said adhesive at a second section distant from the section at which said semiconductor substrates are adjacent to each other.

14. The method according to claim 13, wherein said adhesive is employed in a greater amount at a section of a side of which said plurality of semiconductor substrates are adjacent to each other.

15. The method according to claim 13, wherein plural kinds of said adhesive are employed.

16. The method according to claim 13, wherein the second elastic modulus is greater than the first elastic modulus.

17. The method according to claim 13, wherein said adhesive is employed in a line.

18. The method according to claim 13, wherein said adhesive is employed in a line at a section of a side at which said plurality of semiconductor substrates are adjacent to each other, and is employed in dots at a region distant from the section.

19. The method according to claim 13, wherein said space is maintained by a spacer.

20. The method according to claim 13, wherein said reference plane has means for positioning said semiconductor substrates.

21. The method according to claim 20, wherein said means for positioning is a pin.

22. The method according to claim 13, wherein said adhesive is photo-hardening.

23. The method according to claim 13, wherein said step for hardening said adhesive includes irradiating said adhesive with light for hardening said adhesive.

24. A manufacturing method for a photoelectric conversion apparatus having a two dimensional photoreceiving surface comprising the steps of:

(a) disposing, on a stage, a plurality of semiconductor element substrates on which a plurality of photoreceiving sections are disposed two-dimensionally so as to align, with a reference plane, sides on which said photoreceiving sections are formed;

(b) disposing, on a base through an adhesive, said semiconductor element substrates at a side opposite to the side on which said photoreceiving sections are formed; and (c) hardening said adhesive while maintaining a distance between positions of said reference plane and said base, wherein, after hardening, an elasticity of said adhesive at a section at a side of which said plurality of semiconductor substrates are adjacent to each other is different from an elasticity of said adhesive at a second section distant from the section at which said semiconductor substrates are adjacent to each other.

25. The method according to claim 24, wherein said adhesive is employed in a greater amount at a section of a side at which said plurality of semiconductor substrates are adjacent to each other.

26. The method according to claim 24, wherein plural kinds of said adhesive are employed.

27. The method according to claim 24, wherein said adhesive changes its elasticity after hardening.

28. The method according to claim 24, wherein the elasticity of the second section is greater than the elasticity at the section at the side of which said plurality of semiconductor substrates are adjacent to each other.

29. The method according to claim 24, wherein said adhesive is employed in a line on a side at which said plurality of semiconductor substrates are adjacent to each other.

30. The method according to claim 24, wherein said adhesive is employed in a line on a section of a side at which said plurality of semiconductor substrates are adjacent to each other and is employed in dots on a region distant from the section.

31. The method according to claim 24, wherein said distance is maintained by a spacer.

32. The method according to claim 24, further comprising means for positioning said base and said semiconductor substrates.

33. The method according to claim 32, wherein said means for positioning comprises a pin.

34. The method according to claim 24, wherein said adhesive is photo-hardening.

35. The method according to claim 24, wherein said step for hardening said adhesive includes irradiating said adhesive with light for hardening said adhesive.

36. The method according to claim 24, further comprising a step for providing a wavelength conversion member on a photoreceiving section.

37. The method according to claim 36, wherein said wavelength conversion member has a phosphor.

38. The method according to claim 36, wherein said wavelength conversion member is provided through an adhesive on a photoreceiving section.

39. A manufacturing method for a photoelectric conversion apparatus having a two dimensional photoreceiving surface comprising the steps of:
   a) disposing, on a stage, a plurality of semiconductor substrates on which photoreceiving sections are arranged two dimensionally so as to align, with a reference plane, sides on which said photoreceiving sections are formed; and
   b) disposing an adhesive on said semiconductor substrate at a side opposite to the side on which said photoreceiving section is formed to fix said semiconductor substrates to a base,
   wherein after hardening, an elasticity of said adhesive at a section at a side of which said plurality of semiconductor substrates are adjacent to each other is different from an elasticity of said adhesive at a second section distant from the section at which said semiconductor substrates are adjacent to each other.

40. The method according to claim 39, wherein said adhesive is employed in a greater amount at a section at a side at which said plurality of semiconductor substrates are adjacent to each other.

41. The method according to claim 39, wherein plural kinds of said adhesive are employed.

42. The method according to claim 39, wherein said adhesive changes its elasticity after hardening.

43. The method according to claim 39, wherein the elasticity of the second section is greater than the elasticity at the section at the side of which said plurality of semiconductor substrates are adjacent to each other.

44. The method according to claim 39, wherein said adhesive is employed in a line on a side at which said plurality of semiconductor substrates are adjacent to each other.

45. The method according to claim 39, wherein said adhesive is employed in a line on a section of a side at which said plurality of semiconductor substrates are adjacent to each other and is employed in dots on a region distant from the section.

46. The method according to claim 39, wherein a distance between said base and said stage is maintained by a spacer.

47. The method according to claim 39, wherein said stage comprises means for positioning said semiconductor substrates.

48. The method according to claim 47, wherein said means for positioning comprises a pin.

49. The method according to claim 39, wherein said adhesive is photo-hardening.

50. The method according to claim 39, further comprising a step of hardening said adhesive by irradiating said adhesive with light.

51. The method according to claim 39, wherein said stage is capable of suction to hold said semiconductor substrates.

52. The method according to claim 39, wherein said stage produces a suction force in a region corresponding to each of said semiconductor substrates, thereby holding by suction force each of said semiconductor substrates.

53. The method according to claim 39, wherein each of said semiconductor substrates has a plurality of photoelectric conversion elements, arranged in a matrix.

54. The method according to claim 39, further comprising a step for providing a wavelength conversion member on a photoreceiving section.

55. The method according to claim 54, wherein said wavelength conversion member has a phosphor.

56. The method according to claim 39, wherein a wavelength conversion member is provided through an adhesive on a photoreceiving section.

57. A manufacturing method for a photoelectric conversion apparatus having a two dimensional photoreceiving surface which includes a plurality of semiconductor element substrates on which a plurality of photoreceiving sections of photoelectric conversion elements are arranged two dimensionally; a base on which said plurality of semiconductor element substrates are arranged fixedly; and an adhesive for fixing said plurality of semiconductor element substrates to said base, wherein said adhesive has a variation in a thickness thereof so as to align in the same plane photoreceiving surface side levels of said photoelectric conversion elements of said semiconductor element substrates,
   which comprises the steps of:
      (a) fixing said plurality of semiconductor element substrates so as to align, with a reference plane, sides on which said photoreceiving sections are formed;
      (b) disposing, on said base through said adhesive, said semiconductor element substrates at a side opposite to the side on which said photoreceiving sections are formed; and
      (c) hardening said adhesive while maintaining a space between said reference plane and said base,
   wherein said adhesive is employed in a line on a section of a side at which said plurality of semiconductor substrates are adjacent to each other, and is employed in dots on a region distant from the section.

58. A manufacturing method for a photoelectric conversion apparatus having a two dimensional photoreceiving surface including a plurality of semiconductor element substrates on which a plurality of photoreceiving sections of photoelectric conversion elements are arranged two dimensionally, a base on which said plurality of semiconductor element substrates are disposed fixedly, and an adhesive for fixing said plurality of semiconductor element substrates to said base, wherein said adhesive has a variation in a thickness thereof so as to align, with the same plane, photoreceiving surface side levels of said photoelectric conversion elements of said semiconductor element substrates, which method comprises the steps of:
   a) fixing one of said plurality of semiconductor element substrates so as to align, with a reference plane, a side on which the photoreceiving section is formed;
   b) disposing said base through said adhesive on the semiconductor element substrate from step (a) at a side opposite to the side on which the photoreceiving section is formed; and
   c) hardening said adhesive keeping a space between said reference plane and said base; and
   d) repeating steps (a), (b) and (c) for the remainder of the plurality of semiconductor element substrates using the same reference plane as in step (a),
   wherein said adhesive is employed in a line at a section of a side at which said plurality of semiconductor substrates are adjacent to each other, and is employed in dots at a region distant from the section.

59. A manufacturing method for a photoelectric conversion apparatus having a two dimensional photoreceiving surface comprising the steps of:
(a) disposing, on a stage, a plurality of semiconductor element substrates on which a plurality of photoreceiving sections are disposed two-dimensionally so as to align, with a reference plane, sides on which said photoreceiving sections are formed;
(b) disposing, on a base through an adhesive, said semiconductor element substrates at a side opposite to the side on which said photoreceiving sections are formed; and
(c) hardening said adhesive while maintaining a distance between positions of said reference plane and said base,
wherein said adhesive is employed in a line on a section of a side at which said plurality of semiconductor substrates are adjacent to each other and is employed in dots on a region distant from the section.

60. A manufacturing method for a photoelectric conversion apparatus having a two dimensional photoreceiving surface comprising the steps of:
a) disposing, on a stage, a plurality of semiconductor substrates on which photoreceiving sections are arranged two dimensionally so as to align, with a reference plane, sides on which said photoreceiving sections are formed; and
b) disposing an adhesive on said semiconductor substrate at a side opposite to the side on which said photoreceiving section is formed to fix said semiconductor substrates to a base,
wherein said adhesive is employed in a line on a section of a side at which said plurality of semiconductor substrates are adjacent to each other and is employed in dots on a region distant from the section.

* * * * *